(12) United States Patent
Henzler

(10) Patent No.: US 9,190,906 B2
(45) Date of Patent: Nov. 17, 2015

(54) DIGITAL EVENT GENERATOR, COMPARATOR, SWITCHED MODE ENERGY CONVERTER AND METHOD

(75) Inventor: Stephan Henzler, Munich (DE)

(73) Assignee: Intel Deutschland GmbH, Neubiberg (DE)

( * ) Notice: Subject to any disclaimer, the term of this patent is extended or adjusted under 35 U.S.C. 154(b) by 735 days.

(21) Appl. No.: 13/473,213

(22) Filed: May 16, 2012

(65) Prior Publication Data

US 2013/0307509 A1    Nov. 21, 2013

(51) Int. Cl.
*H02M 3/157*    (2006.01)
*H03K 7/08*    (2006.01)

(52) U.S. Cl.
CPC *H02M 3/157* (2013.01); *H03K 7/08* (2013.01)

(58) Field of Classification Search
CPC ......... H02M 3/157; H03K 7/08; H03K 23/40; H03M 2201/4233; G06F 1/14
USPC .............................. 341/152; 377/39; 323/283
See application file for complete search history.

(56) References Cited

U.S. PATENT DOCUMENTS

| 5,428,639 A * | 6/1995 | Orbach et al. ................ 375/238 |
| 6,097,782 A * | 8/2000 | Foroudi .......................... 377/47 |
| 2002/0190768 A1* | 12/2002 | Bowling ........................ 327/175 |
| 2006/0055574 A1* | 3/2006 | Maksimovic et al. ........ 341/155 |
| 2006/0064609 A1* | 3/2006 | Bryan ............................ 714/700 |
| 2006/0164142 A1* | 7/2006 | Stanley .......................... 327/172 |
| 2008/0101453 A1 | 5/2008 | Yau |
| 2008/0252351 A1* | 10/2008 | Deppe et al. .................. 327/175 |
| 2009/0067487 A1 | 3/2009 | Diewald |
| 2010/0045377 A1* | 2/2010 | Witchard ...................... 330/251 |
| 2012/0153917 A1* | 6/2012 | Adell et al. ................... 323/283 |
| 2012/0154005 A1* | 6/2012 | Frederiksen et al. ......... 327/175 |

OTHER PUBLICATIONS

David Figoli. "Higher switching frequencies demand better control of PWM duty cycles." Texas Instruments, Dallas. Jul. 13, 2005. 5 Pages.

* cited by examiner

*Primary Examiner* — Fred E Finch, III
(74) *Attorney, Agent, or Firm* — Eschweiler & Associates, LLC

(57) ABSTRACT

A digital event generator includes a counter configured to provide at least one count value based on a clock signal, and a comparator configured to evaluate a first portion of a first count value to detect a near occurrence of an event, in response to a detection of a near occurrence of an event, evaluate a second portion of a second count value, and provide the event signal based on the evaluation and digital event time information. A switched mode energy converter uses said digital event generator.

30 Claims, 12 Drawing Sheets conventional counter running with a high
clock rate and high accuracy

DIGITAL EVENT GENERATOR, COMPARATOR, SWITCHED MODE ENERGY CONVERTER AND METHOD

FIELD

The present disclosure is related to a digital event generator, a comparator, and a switched mode energy converter. In particular, the present disclosure is related to a method for providing an event signal based on digital event time information.

BACKGROUND

In many applications, it is desirable to provide an event signal based on digital event time information. Digitally controlled DCDC converters are switched mode power supplies with a digital control loop. Besides the digital compensator (controller) the digital pulse width modulator is a core component of the control loop and acts as a digital-to-analog or more precisely as a digital-to-time converter which translates the digital duty cycle information into a pulse width modulated signal. It is usually implemented by a counter which is incremented/decremented in response to a digital clock signal. At the beginning of each switching period of the DCDC converter, the counter may be initialized with a start value. In each clock cycle during each clock switching period, the instantaneous counter value is compared to the digital control signal (or digital control value) provided by the compensator. When the counter value is equal to this control value, an event is triggered. In the specific example of the digital pulse width modulator, the pulse width modulation signal (PWM signal) is set either to high or to low. Usually, there are additional comparators which compare the counter value to other control signals and create other events. The sampling of the feedback analog-to-digital converter (ADC) is an example for such an additional event: a control value indicates the desired sampling point. When the counter (or counter value) is equal to this control signal (or control value), a sampling event is issued.

It is a trend in the design of switched mode power supplies (DCDC converters) to increase the switching frequency. It has been found that this often brings along that the clock frequency of the digital pulse width generator (DPWM generator) is increased, too. This means that the counter is incremented (or decremented) more often, and that each comparison is done more often. It has been found that a drawback is an increased power consumption of the digital control loop, which results in decreased DCDC converter efficiency. However, the latter is a key performance figure. For mobile products, the efficiency at low load currents is of particular importance. It has been found that, unfortunately, the efficiency decrease due to the digital control loop is visible especially at low load currents.

Accordingly, in some conventional digitally controlled DCDC converters, the switching frequency is relatively low. However, this brings along the drawbacks that there is a slow response to load and line jumps and there is also a slow response for dynamic voltage scaling. Also, such an architecture using a relatively low switching frequency is not feasible for high-speed converters, e.g. for envelope tracking. Moreover, DCDC converters with a relatively low switching frequency typically require large passive components.

In some other conventional DCDC converters, asynchronous or analog techniques are applied. For example, the counter is running with a reduced but constant frequency and a high resolution is achieved asynchronously by delay elements or multi-phase clocks. A drawback of such concepts is that many advantages of synchronous digital design, such as noise immunity, robustness, design automation, etc., get lost when these asynchronous techniques are used.

In view of this situation, there is a desire to have an energy efficient concept for a provision of an event signal with good accuracy. Also, there is a desire to have a digitally controlled energy converter with good efficiency even at comparatively high switching frequencies.

SUMMARY

One aspect of the present disclosure provides a digital event generator comprising a counter configured to provide at least one count value based on a clock signal, and a comparator configured to evaluate a first portion of a first count value to detect a near occurrence of an event, in response to a detection of a near occurrence of an event, evaluate a second portion of a second count value, and provide the event signal based on the evaluation and digital event time information.

One aspect of the present disclosure provides a switched-mode energy converter comprising a power stage comprising one or more switches, a digital control circuit configured to provide a digital event time information, to control or regulate an electrical output quantity, and a digital event generator for generating an event signal based the digital event time information. The digital event generator comprises a counter configured to provide at least one count value based on a clock signal, and a comparator configured to evaluate a first portion of a first count value to detect a near occurrence of an event, in response to a detection of a near occurrence of an event, evaluate a second portion of a second count value, and provide the event signal based on the evaluation and digital event time information.

One aspect of the present disclosure provides a comparator for providing an event signal, wherein the comparator is configured to evaluate a low-temporal-resolution portion of a first count value to detect a near occurrence of an event, and evaluate a high-temporal-resolution portion of a second count value in response to a detection of a near occurrence of an event, and generate the event signal based on the evaluation of the high-temporal-resolution portion of the count value.

One aspect of the present disclosure provides a method for providing an event signal. The method comprises providing a plurality of count values based on a clock signal, evaluating a first portion of a first count value, to detect a near occurrence of an event, evaluating a second portion of a second count value in response to a detection of a near occurrence of an event, and generating the event signal from the evaluation of the second portion of the second count value and a digital event time information.

One aspect of the present disclosure provides a digital event generator comprising a counter configured to provide at least one count value based on a clock signal, and a comparator configured to evaluate at least one portion of at least one of the count values to detect a near occurrence of an event, in response to a detection of a near occurrence of an event, evaluate at least one portion of at least one of the count values, and provide the event signal based on the evaluation and digital event time information.

One aspect of the present disclosure provides a switched-mode energy converter comprising a power stage comprising one or more switches, a digital control circuit configured to provide a digital event time information, to control or regulate an electrical output quantity, and a digital event generator for generating an event signal based the digital event time information. The digital event generator comprises a counter configured to provide at least one count value based on a clock signal, and a comparator configured to evaluate at least one portion of at least one of the count values, detect a near occurrence of an event, in response to a detection of a near occurrence of an event evaluate at least one portion of at least one of the count values, and generate the event signal based on the evaluation and digital event time information.

One aspect of the present disclosure provides a digital event generator for providing an event signal based on a digital event time information. The digital event generator comprises a counter configured to provide count values based on a clock signal. The digital event generator also comprises a comparator configured to evaluate a low-temporal resolution count value (or even a plurality of low-temporal-resolution count values) provided by the counter, to detect a near occurrence of an event, and evaluate a high-temporal-resolution count value (or even a plurality of high-temporal resolution count values) provided by the counter in response to a detection of a near occurrence of an event. The comparator is configured to provide the event signal based on the evaluation of the high-temporal resolution count value (or even count values) and based on the digital event time information.

According to an aspect of the present disclosure, the counter may be a timer or a time reference generator.

Another aspect of the present disclosure provides a comparator for providing an event signal based on a count value (or even a plurality of count values) and a digital event time information. The comparator is configured to evaluate a low-temporal-resolution portion of (at least) one of the count values, to detect a near occurrence of an event, and evaluate a high-temporal-resolution portion of (at least) one of the count values in response to the detection of a near occurrence of an event. Moreover, the comparator is configured to provide the event signal based on the evaluation of the high-temporal-resolution portion of the count value.

Yet another aspect of the present disclosure provides a switched mode energy converter for providing an electrical output quantity (for example, an output voltage or an output current) based on an electrical input energy (for example, from a voltage source or a current source). The energy converter comprises a power stage comprising one or more switches. The energy converter also comprises a digital control circuit configured to provide digital event time information, to control or regulate the electrical output quantity. Also, the energy converter comprises a digital event generator for providing an event signal based on the digital event time information. The digital event generator comprises a counter configured to provide count values based on a clock signal and a comparator. The comparator is configured to evaluate a low-temporal-resolution count value provided by the counter, to detect a near occurrence of an event, and evaluate a high-temporal-resolution count value provided by the counter in response to the detection of a near occurrence of an event. The comparator is also configured to provide the event signal based on the evaluation of the high-temporal-resolution count value and the digital event time information.

Still another aspect of the present disclosure provides a method for providing an event signal based on digital event time information. The method comprises providing count values based on a clock signal. The method also comprises evaluating a low-temporal-resolution count value to detect a near occurrence of an event. The method also comprises evaluating a high-temporal-resolution count value in response to a detection of a near occurrence of an event. Also, the method comprises providing the event signal based on the evaluation of the high-temporal-resolution count value and the digital event time information.

Yet another aspect of the present disclosure provides a digital event generator for providing an event signal based on digital event time information. The digital event generator comprises a counter configured to provide count values based on a clock signal and a comparator configured to evaluate a low-temporal-resolution count value provided by the counter, to detect a near occurrence of an event, and evaluate a high-temporal-resolution count value provided by the counter in response to a detection of a near occurrence of an event, and provide the event signal based on the evaluation of the high-temporal-resolution count value and the digital event time information. The digital event generator is configured to reduce a counter step size in response to the detection of a near occurrence of an event, and increase a counter count rate in response to the detection of the near occurrence of an event. The comparator is configured to perform a low-temporal-resolution comparison prior to the detection of a near occurrence of an event, and perform a high-temporal-resolution comparison in response to the detection of a near occurrence of an event. The digital event generator is also configured to detect the near occurrence of an event based on the low-temporal-resolution comparison. The comparator is configured to evaluate a first subset of bits of a count value of the counter prior to a detection of a near occurrence of an event, and evaluate a second subset of bits of a count value of the counter in response to a detection of a near occurrence of an event, wherein the first subset of bits describes a more-significant portion of the count value than the second subset of bits. The comparator is configured to evaluate a relative time, relative to a time determined by the low-temporal-resolution comparison, in the high-temporal-resolution comparison.

BRIEF DESCRIPTION OF THE FIGURES

Embodiments according to the present invention will subsequently be described taking reference to the enclosed figures, in which.

DETAILED DESCRIPTION

Figure 1:
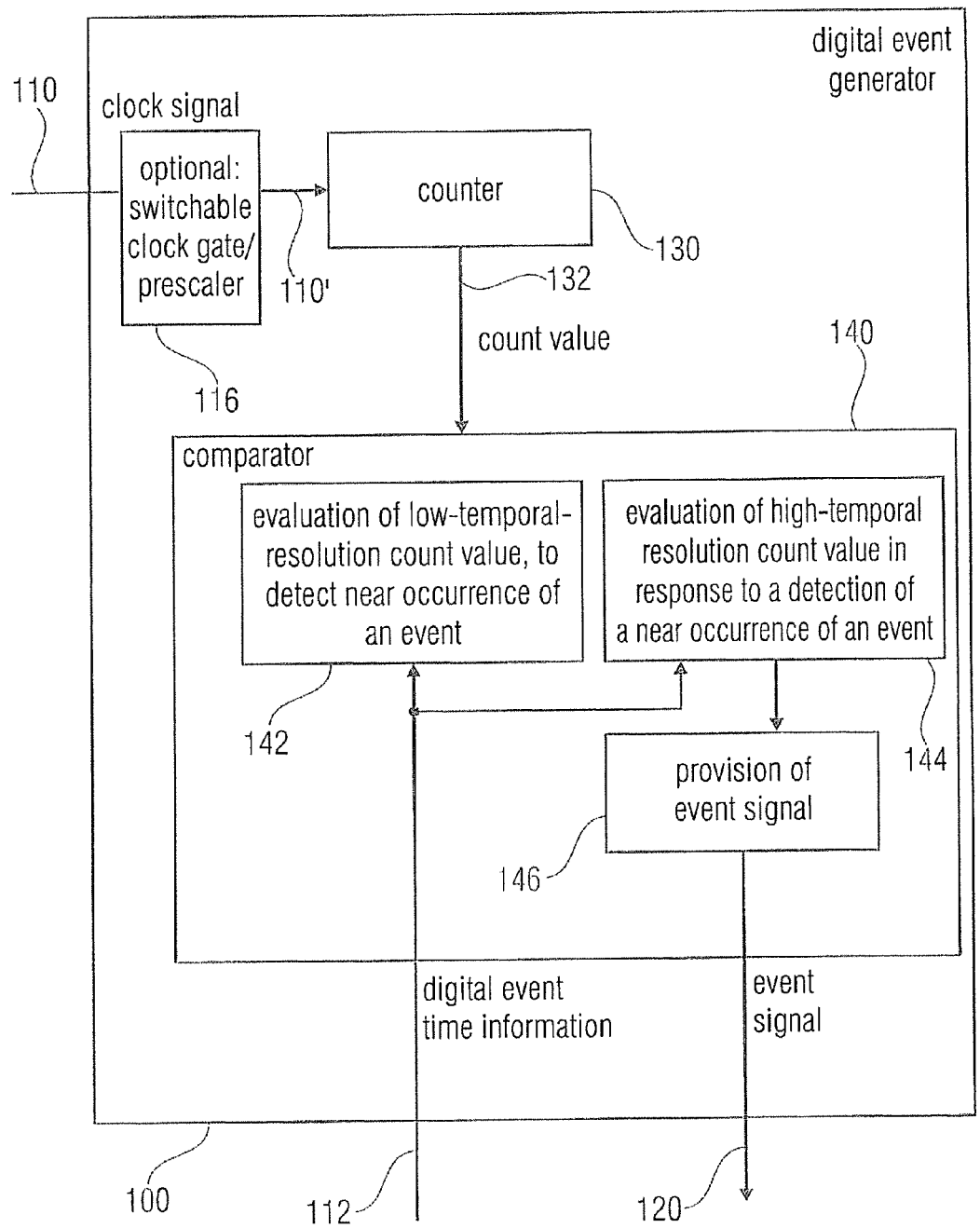
FIG. 1 shows a block schematic diagram of a digital event generator, according to one aspect of the present disclosure.

FIG. 1 shows a block schematic diagram of a digital event generator, according to one aspect of the present disclosure.

The digital event generator according to FIG. 1 is designated in its entirety with 100. The digital event generator 100 receives (or, equivalently, generates by itself) a clock signal 110. Also, the digital event generator 100 typically receives a digital event time information 112, which may, for example, take the form of a binary encoded value. However, different types of encoding of the value representing the digital event time information 112 may naturally be used. On the other hand, the digital event generator 100 generates an event signal 120, wherein a time at which the event signal (or, more precisely, a pulse or a transition of the event signal) is provided is determined by the digital event time information 112. Naturally, there may be a time reference to which the digital event time information 112 refers to, for example, a time at which the counter 130 is reset.

The counter 130 typically receives the clock signal 110, or, alternatively, a gated or pre-scaled version 110' thereof. The counter 130 provides count values 132 based on the clock signal 110 (or the gated or pre-scaled version 110' thereof). It should be noted that the counter 130 typically provides a rapid sequence of count values, wherein the term "count value" refers to a value provided by the counter at a specific instance in time. However, count values provided at different instances of time are typically evaluated by the digital event generator 100. Moreover, it should be noted that the count values 132 provided by the counter 130 are typically digitally encoded, for example, binary-coded.

The digital event generator 100 also comprises a comparator 140, which is configured to evaluate a low-temporal-resolution count value provided by the counter 130, to detect a near occurrence of an event. This functionality may, for example, be obtained by a circuit block 142. However, it is not required to have a dedicated circuit block in some embodiments, It should be noted that the term "low-temporal-resolution count value" includes a low-temporal-resolution portion of a "full" count value 132, like, for example, a subset or more-significant bits of a count value or a rounded version of the count value. Moreover, the comparator 140 is configured to evaluate a high-temporal-resolution count value provided by the counter 130 in response to a detection of a near occurrence of an event. This functionality may, for example, be obtained by a circuit block 144. However, it is not required to have a dedicated circuit block in some embodiments. It should be noted that the term "high-temporal-resolution count value" also includes a high-temporal-resolution portion of a "full" count value 132, like, for example, a subset of less-significant bits of a (full) count value. Moreover, the comparator 140 is configured to provide the event signal 120 based on the evaluation of the high-temporal-resolution count value and the digital event time information 112. This functionality may, for example, be obtained by a circuit block 146. However, it is not required to have a dedicated circuit block in some embodiments.

To summarize, the digital event generator 100 comprises the counter 130 configured to provide count values 132 based on a clock signal 110 and the digital event generator 100 also comprises a comparator 140 configured to evaluate a low-temporal-resolution count value (out of the plurality of count values) provided by the counter, to detect a near occurrence of an event, and evaluate a high-temporal-resolution count value (out of the plurality of count values) provided by the counter 132 in response to a detection of a near occurrence of an event, and provide the event signal 120 based on evaluation of the high-temporal-resolution count value and the digital event time information 112.

Regarding the functionality of the digital event generator 100, it should be noted that the comparator 140 operates particularly efficiently because only one or (typically) more low-temporal-resolution count values are evaluated at a time at which an occurrence of an event is not expected in the close temporal future, (i.e., temporally far enough away from an event). Accordingly, a power consumption is kept low due to the fact that the evaluation (as well as the provision) of low-temporal-resolution count values can be performed with a comparatively low rate (when compared to an evaluation of high-temporal-resolution count values). Also, it is typically not necessary to evaluate (for example, compare to a value derived from the digital event time information 112) the full count values 132 provided by the counter 130. Rather, it is often sufficient to evaluate a low-temporal-resolution portion of the count values 132 provided by the counter 130 in order to detect the near occurrence of an event, which helps to save energy.

Once the near occurrence of an event is detected, i.e., once it has been found that an event is expected within a comparatively small interval of count values 132 provided by the counter 130, one or more high-temporal-resolution count values are evaluated in order to detect the actual event. In other words, in response to the detection of the near occurrence of an event, the temporal resolution with which the count values 132 are evaluated (and, potentially but not necessarily, the temporal resolution with which the count values 132 are provided or generated), is increased. Different concepts are possible here. For example, the temporal resolution of the count values 132 themselves can be increased (for example, by operating the counter 130 with increased temporal resolution, as will be discussed below). Alternatively or in combination with the concept, it is possible to evaluate a different portion (for example, a less-significant portion) of the count values 132 when compared to a mode of operation, in which the near occurrence of an event is to be detected. In this case, in the mode of operation in which the actual time of an event is to be detected, the evaluation precision can be increased by increasing the precision (temporal-resolution) of the count values 132 provided by the counter 130 and/or by evaluating less-significant bits of the count values 132 (when compared to the mode of operation in which the near occurrence of an event is to be detected).

Thus, a number of different concepts may be used for switching between an evaluation of low-temporal-resolution count values, to detect a near occurrence of an event, and an evaluation of high-temporal-resolution count values, to detect an actual occurrence of an event. Typically, the detection of the actual occurrence of an event triggers the provision of a pulse of the event signal or of an edge of the event signal 120.

An assumption is that it is sufficient to evaluate low-temporal-resolution count values 132 provided by the counter 130 as long as it is found (for example, by the comparator 140) that an actual event is still far enough away, and it is sufficient to switch to an evaluation of one or more high-temporal-resolution count values 132 provided by the counter 130 if it is determined (for example, by the comparator 140) that an event is expected to occur in the very near future. For example, a switching from the evaluation of a low-temporal-resolution count value to an evaluation of a high-temporal-resolution count value may be performed when it is found (for example, as a result of the evaluation of the low-temporal-resolution count values) that an event is likely to occur (or will surely occur) prior to a next evaluation of a low-temporal-resolution count value. As a result, more energy can be saved when the evaluation of a high-temporal-resolution count value (which is normally more power-consuming than an evaluation of a low-temporal-resolution count value) is only performed shortly before the actual occurrence of an event, but not during a full count cycle of the counter 130. Accordingly, a significant amount of energy can be saved using the digital event generator 100 when compared to a conventional digital event generator having a comparable temporal-resolution.

In some cases, the high resolution count values may be only generated if the event time approaches soon. Accordingly, the power consumption can be reduced even more. In other words, power may be also saved because less count values are generated while the digital event generator is in its low temporal resolution mode.

In the following, some optional aspects of the digital event generator 100 will be described.

In an example implementation, the digital event generator 100 is configured to reduce counter step size of the counter 130 in response to a detection of a near occurrence of an event, and increase a counter clock rate of the counter 130 in response to the detection of the near occurrence of an event. For example, the counter 130 may be configured to count up or count down at a first, comparatively large step size if it is determined that no event will occur within a certain amount of time (or if there is no detection of the near occurrence of an event). For example, the counter 130 may be controlled to count up or count down in a first step size, if it is determined, for example, by the comparator 140, that no event will occur within a period of time which is described by one step (or by a predetermined number of steps) of the first step size. In contrast, if it is determined, for example, by the comparator 140, that an event is about to occur within a predefined period of time, for example, by one or more steps of the first step size, the counter may be controlled (for example by the comparator 140 or a control circuit coupled between the comparator and the counter) to count at a second step size, which is smaller than the first step size. This may be achieved by changing the counter step size. However, the clock rate of the switched or pre-scaled clock signal 110' input into the counter 130 (to clock the counter) may also be changed based on whether it is determined that an event is about to occur within the predetermined period of time (which should also be considered as a detection of a near occurrence of an event). For example, the clock rate of the switched or pre-scaled clock signal 110' may be increased by the same factor by which the step size of the counter 130 is reduced in response to the detection of a near occurrence of an event. Thus, the count value 130 provided by the counter may change more often per unit time in response to the detection of the near occurrence of an event than prior to the detection of the near occurrence of the event. However, it may be reached that a change of the count values 132 provided by the counter 130 per unit time may be equal before the detection of the near occurrence of an event and after the detection of the near occurrence of an event. In other words, a product of the counter step size of the counter 130 and the clock rate of the pre-scaled or gated clock signal 110' may be identical both before the detection of the near occurrence of the event and after (i.e., in response to) the detection. Accordingly, an evaluation of the count values can be kept simple while a power required for the provision of the count values can be kept small before the detection of the near occurrence of an event.

According to one optional aspect of the present disclosure, the comparator 140 may be configured to perform a low-temporal-resolution comparison prior to a detection of a near occurrence of an event, and to perform a high-temporal-resolution comparison in response to a detection of a near occurrence of an event. A low-temporal-resolution comparison may, for example, comprise an evaluation of a first subset of bits of one or more count values of the counter. Also, a high-temporal-resolution comparison may, for example, comprise an evaluation of a second set of bits of one or more count values of the counter. Thus, the first subset of bits may describe a more significant portion of the count values than the second subset of bits. Accordingly, a power consumption for the comparison can be kept low in both modes of operation (low-temporal-resolution mode of operation and high-temporal-resolution mode of operation).

In other words, the comparator may be configured to compare the subset of more-significant bits (for example, including the most significant bits and not including one or more of the least significant bits of the considered count value) with a portion of the digital event time information 112 (for example, a portion of the digital event time information 112 including the most-significant bits of the digital event time information, but not including one or more of the least-significant bits of the digital event time information) prior to the detection of the near occurrence of an event (i.e., when checking for the near occurrence of an event). Also, in response to the detection of the near occurrence of an event, the comparator may perform, instead of the evaluation of a low-temporal-resolution count value, an evaluation of a high-temporal-resolution count value, wherein the evaluation may comprise a comparison based on a subset of bits of a count value 132 including a least-significant bit, but not necessarily including one or more of the most-significant bits of the count value 132. However, it should be noted that, in principle, the full count value may be used for comparison, wherein the usage of the subset is typically advantageous. The subset of bits of the currently considered count value 132 may be compared with a subset of bits of the digital event time information 112 including, for example, the least-significant bit of said digital event time information, but not necessarily including one or more of the most-significant bits of the digital event time information 112. The subset of bits of the currently considered count value 132 evaluated prior to the detection of the near occurrence of an event by the comparator 140 may be overlapping or non-overlapping with the subset of bits of the currently considered count value 132 evaluated by the comparator in response to the detection of the near occurrence of an event. However, in a possible implementation, two subsets of bits of the count value 132 are non-overlapping, because a very high efficiency can be achieved in this way.

According to an optional aspect of the present disclosure, the digital event generator 100 may be configured to detect the near occurrence of an event based on the low-temporal-resolution comparison performed by the comparator 140. Thus, the near occurrence of an event may be detected with comparatively low effort, since the low-temporal-resolution comparison (for example, between a low-temporal-resolution portion of the count values 132 and a low-temporal-resolution portion of the digital event time information 112) does not require a high amount of power. The usage of a low-temporal-resolution comparison brings along the advantage that the number of comparisons per time unit can be kept comparatively small, and that the number of bits of the count values 132 evaluated in the comparison(s) can also be kept comparatively small.

According to an optional aspect of the present disclosure, the comparator may be configured to evaluate a first subset of bits of a currently considered count value (or of the count values) 132 of the counter 130 prior to the detection of a near occurrence of an event, and to evaluate a second subset of bits of the currently considered count value (or of the count values) 132 of the counter in response to a detection of a near occurrence of an event. In one embodiment, the first subset of bits describes a more-significant portion of the count value (or of the count values) than the second subset of bits.

According to an optional aspect of the present disclosure, the comparator 140 may be configured to evaluate a relative time, which is relative to a time determined by the low-temporal-resolution comparison, in the high-temporal-resolution comparison. In other words, the evaluation of the low-temporal-resolution count value (or count values) 132, which is performed prior to the detection of a near occurrence of an event in order to detect the near occurrence of an event, serves as a basis for a relative time evaluation in a second step. It may be exploited that a relative time difference between the detection of the near occurrence of an event and the actual occurrence of the event is described by a subset of one or more least-significant bits of the digital event time information. Accordingly, the detection of the near occurrence of the event may indicate that a time value (described by the count value 132) has been reached which is described by a subset of most-significant bits of the digital event time information. Accordingly, the fact that the near occurrence of an event is detected indicates that a time span between the detection of the near occurrence of the event and the actual occurrence of the event is described by a relative time value (for example, by a subset of one or more least-significant bits of the digital event time information).

Thus, after the detection of the actual occurrence of an event, it is sufficient to evaluate a relative time information (for example, a subset of one or more least-significant bits of the count values 132 and of the event time information) to detect the actual time of the event. This increases the efficiency of the process.

According to an optional aspect of the present disclosure, the digital event generator may be configured to switch back to evaluate one or more low-temporal-resolution count values subsequent to a provision of an event signal (or, more precisely, of a pulse of the event signal or of an edge of the event signal) based on the evaluation of the high-temporal-resolution count value. By switching back to the evaluation of a low-temporal-resolution count value, a power consumption can be reduced when continuing the count operation. In a continuation of the count operation subsequent to the provision of an event signal (or, more precisely, a pulse or an edge of the event signal), a count cycle can be completed and the provision of one or more additional event signals can be prepared.

According to an optional aspect of the present disclosure, the digital event generator 100 may be configured to remain in a mode for an evaluation of a high-temporal-resolution count value for at least a predetermined number of counter steps of the counter 130. Such a functionality allows that event signals for a plurality of events to be provided in response to a single switching to a mode for an evaluation of a high-temporal-resolution count value. This idea is based on the finding that, in many circumstances, a plurality of events occur temporarily closely together. Accordingly, it is avoided to switch unnecessarily often between the mode for an evaluation of a low-temporal-resolution count value and the mode for an evaluation of a high-temporal resolution count value.

According to an optional aspect of the present disclosure, the digital event generator may be configured to switch back to evaluate a low-temporal-resolution count value a predetermined number of counter steps after switching to a mode for an evaluation of a high-temporal-resolution count value. Thus, the timing is simplified. Also, it can be achieved that a length of a time period, during which an evaluation of high-temporal-resolution count values is performed, is equal to, or a multiple of, a time between two subsequent evaluations of low-temporal-resolution count values. Accordingly, a uniform timing grid can be obtained, wherein one or more evaluations of one or more low-temporal-resolution count values are replaced by a sequence of evaluations of high-temporal-resolution count values.

According to an optional aspect of the present disclosure, the comparator 140 may be configured to compare the high-temporal-resolution count value with a plurality of high-temporal-resolution portions of digital event time information associated with a plurality of events in response to a single switching from a mode for an evaluation of a low-temporal-resolution count value to a mode for an evaluation of a high-temporal-resolution count value, to provide event signals for a plurality of events. Thus, it is possible, in some aspects, to efficiently provide event signals for multiple events, which are close together in time.

According to an optional aspect of the present disclosure, the counter 130 may be a synchronous counter, wherein a plurality of counter stages are clocked with a common clock signal. Also, the digital event generator 100 may comprise a clock divider or clock gate 116 to derive the common clock signal (for example, the gated or pre-scaled clock signal 110') for the counter 130 from an input clock signal (for example, from the clock signal 110). Such an implementation provides for fast and ripple-free counting (due to the synchronous nature of the counter). Also, by using the switchable clock gate or pre-scaler 116, the power consumption can be reduced because the number of count operations of the counter 130 per time unit can be kept small in the low-temporal-resolution mode of operation.

According to an aspect of the present disclosure, the digital event generator 110 may be configured to control the clock divider (also designated as clock prescaler) or clock gate to provide a clock signal of a first, lower clock rate as the common clock signal 110' for the counter 130 prior to a detection of a near occurrence of an event, and to provide a clock signal of a second higher clock rate as the common clock signal 110' for the counter 130 in response to a detection of a near occurrence of an event. Thus, the count rate (in terms of count operations per time unit) of the counter 130 can be reduced if no event is expected in the very close future. This helps to save energy.

According to an optional aspect of the present disclosure, the digital event generator is configured such that a number of comparisons performed per unit time between the low-temporal-resolution count values and a first portion of the digital event time information 112 prior to a detection of a near occurrence of an event is smaller than a number of comparisons performed per unit time between the high-temporal-resolution count values and a second portion of the digital event time information 112 after the detection of the near occurrence of an event. Accordingly, the fact that the counter performs less count operations per unit time for the detection of a near occurrence of an event (when compared to the identification of the actual event) can be exploited to also save energy at the side of the comparator 140.

According to an optional aspect of the present disclosure, the digital event generator may further comprise a digital-to-time converter (not shown in FIG. 1), which is configured to receive, as an input signal, the event signal provided by the comparator 130, and generate, as an output signal, a fine-adjusted event signal. The comparator 130 may be configured to detect a near occurrence of an event based on a low-temporal-resolution portion of the digital event time information 112, and generate the event signal based on a medium-temporal-resolution portion of the digital event time information 112. The digital-to-time converter may be configured to provide the fine-adjusted event signal based on a high-temporal-resolution portion of the digital event time information. Accordingly, units of different time resolution may cooperate to provide an event signal (or, more precisely, a pulse or an edge of the event signal) with higher temporal accuracy while keeping the power consumption as small as possible.

According to an aspect of the present disclosure, the digital-to-time converter may comprise a tapped delay line, wherein the tapped delay line is configured to receive the event signal provided by the comparator 130, and wherein the digital-to-time converter is configured such that a tap of the tapped delay line is selected for the provision of the fine-adjusted event signal based on the high-temporal-resolution portion of the digital event time information. Accordingly, a particularly high time resolution can be obtained.

According to an optional aspect, the counter may be configured to cyclically restart from a start value. Accordingly, it is possible, for example, to achieve a high-accuracy pulse width modulation with constant cycle duration.

To summarize, some optional improvements of the digital event generator 112 have been described above. However, it should be noted that the aspects discussed above do not need to be implemented in some embodiments. Also, the improvements discussed above can optionally be introduced into the digital event generators described in the following.

Figure 2:
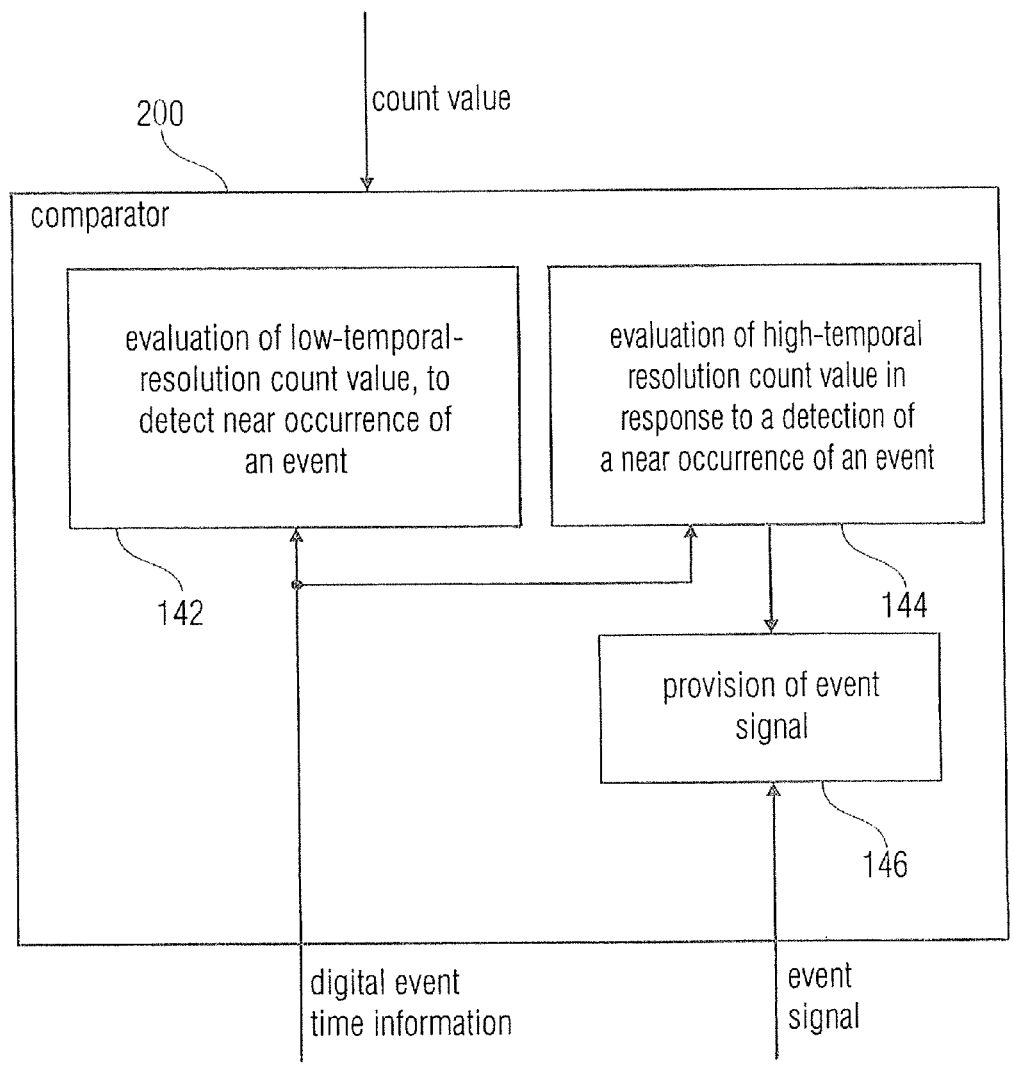
FIG. 2 shows a block schematic diagram of a comparator, according to an another aspect of the present disclosure.

FIG. 2 shows a block schematic diagram of a comparator 200, according to an embodiment of the present disclosure.

It should be noted that the comparator 200 is substantially identical to the comparator 140 described in detail with reference to FIG. 1. Accordingly, for details, reference is made to the above discussion. However, it should be noted that at least some of the advantages described herein may be achieved even if the comparator 200 is used with a conventional counter.

A switching of the comparator between the evaluation of low-temporal-resolution count values, to detect a near occurrence of an event, and the evaluation of high-temporal-resolution count values in response to the detection of the near occurrence of an event, to determine the actual occurrence of an event, allows that a power consumption can be significantly reduced when compared to a conventional comparator. Thus, the comparator 200 according to FIG. 2 is a useful component by itself.

Figure 3:
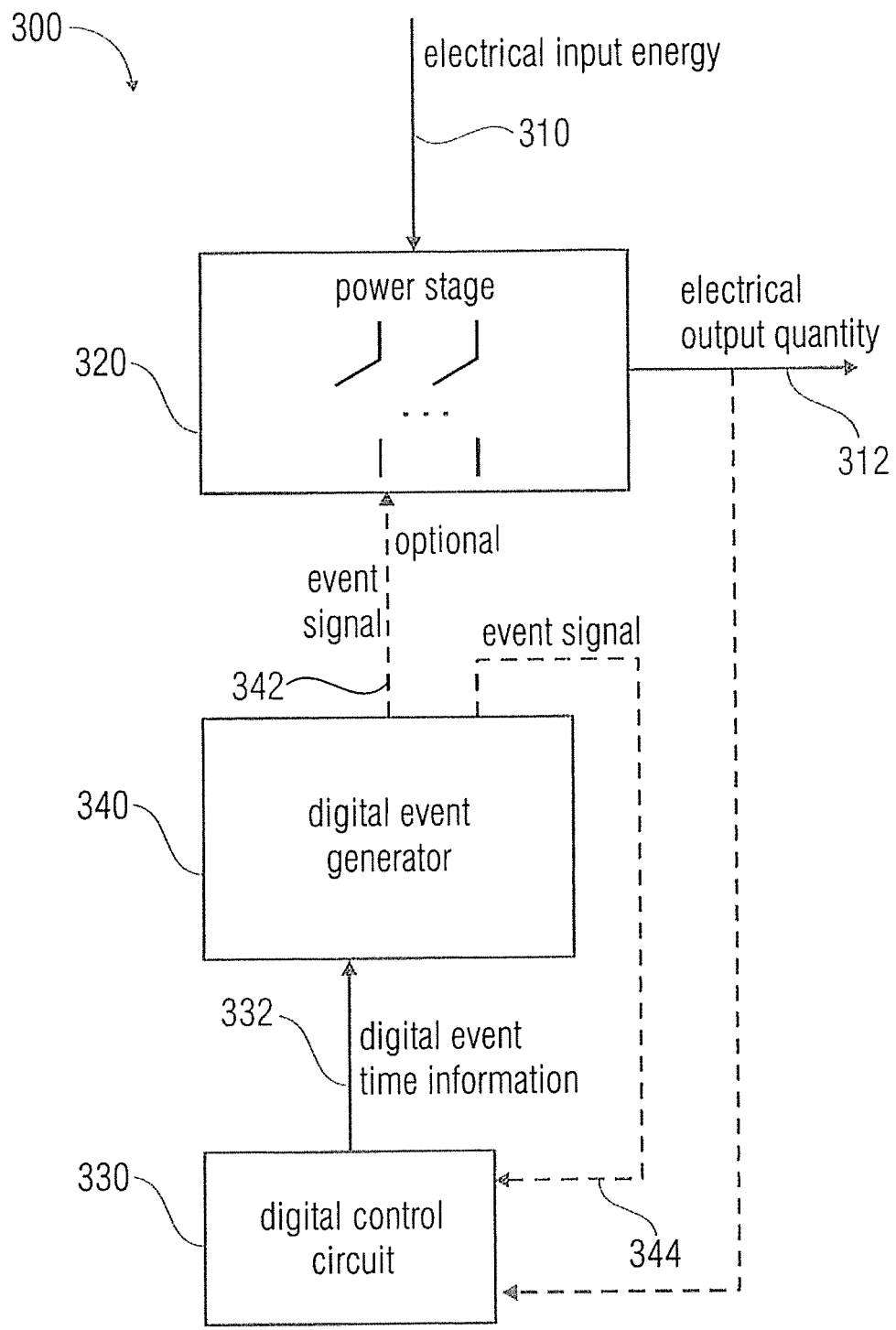
FIG. 3 shows a block schematic diagram of an energy converter, according to an aspect of the present disclosure.

FIG. 3 shows a block schematic diagram of an exemplary switched mode energy converter 300, according to an aspect of the present disclosure. The switched mode energy converter 300 is configured to receive electrical input energy 310 (for example, from a voltage source or a current source) and to provide an electrical output quantity 312 based on the electrical input energy 310. The electrical output quantity may, for example, be an electrical voltage or an electrical current.

The energy converter 300 comprises a power stage 320, which in one embodiment comprises one or more switches. The power stage 320 is typically configured to perform the actual energy conversion, wherein the one or more switches may interact with one or more passive components, like inductors, capacitors, diodes, and so on.

The energy converter 300 also comprises a digital control circuit 330 which is configured to generate a digital event time information 332 and control or regulate the electrical output quantity 312. The digital event time information 332 may, for example, describe a desired switch-on time of a switch of the power stage 320, a desired switch-off time of a switch of the power stage 320, or a sample time of an analog-to-digital-converter for sampling the electrical output quantity 312, or an intermediate quantity. Generally speaking, the digital event time information 332 may describe any control time used within the energy converter 300.

The energy converter 300 also comprises a digital event generator 340, which receives the digital event time information 332 and generates, an event signal 342. The event signal 342 may, for example, be a drive signal for driving one or more of the switches of the power stage 320. Alternatively, or in addition, an event signal 344 provided by the digital event generator 340 may control a timing of the digital control circuit, or a timing of an analog-digital-converter for sampling an electrical quantity for the control or regulation of the electrical output quantity 312, or the like. The digital event generator 340 may be identical to the digital event generator 100 described above, and may, for example, comprise a comparator 200, as described above.

The energy converter 300 is based on the finding that a digital control of an energy converter, using a digital control circuit 330, brings along implementation advantages. A digital control circuit 330 can often be implemented at lower costs and/or lower power consumption than an analog control circuit. Also, control algorithms (or regulation algorithms) can typically be adapted to the requirements with the low effort in such a digital control circuit.

Moreover, it is possible to significantly improve the power efficiency of the energy converter (when compared to conventional digitally controlled energy converters) by using the digital event generator 340 according to the present disclosure. It has been found that the digital event generator 340 allows for the provision of one or more event signals with high timing accuracy without running into a high power consumption. This brings along particular advantages under low-load conditions, because the power consumption of the digital event generator 340 constitutes an important part of the total power consumption in this load condition.

To summarize, usage of the digital event generator 340 in the energy converter 300 brings along a substantial efficiency increase.

Figure 4A:
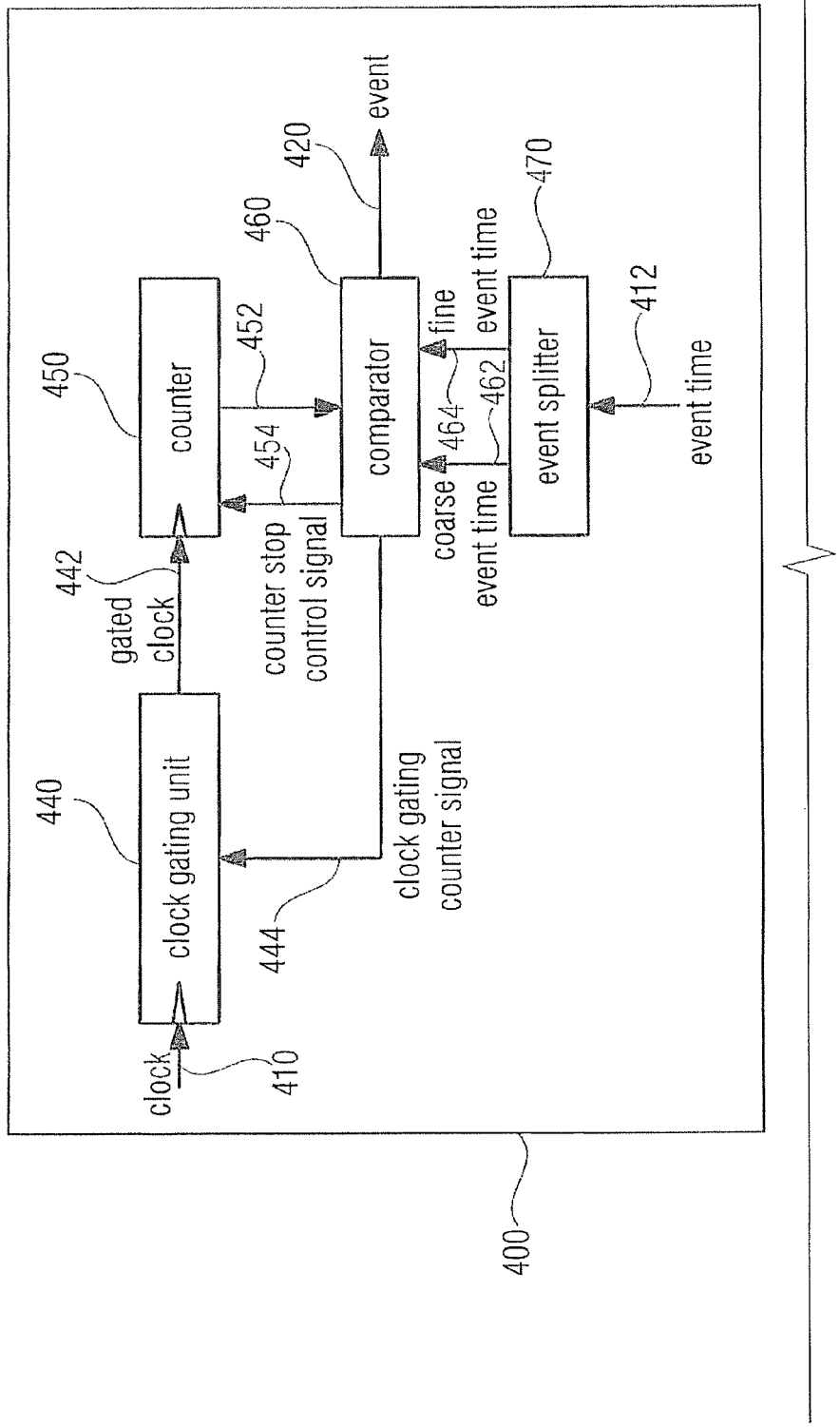
FIG. 4 shows a block schematic diagram of an event generator, according to one aspect of the present disclosure.
Figure 4B:
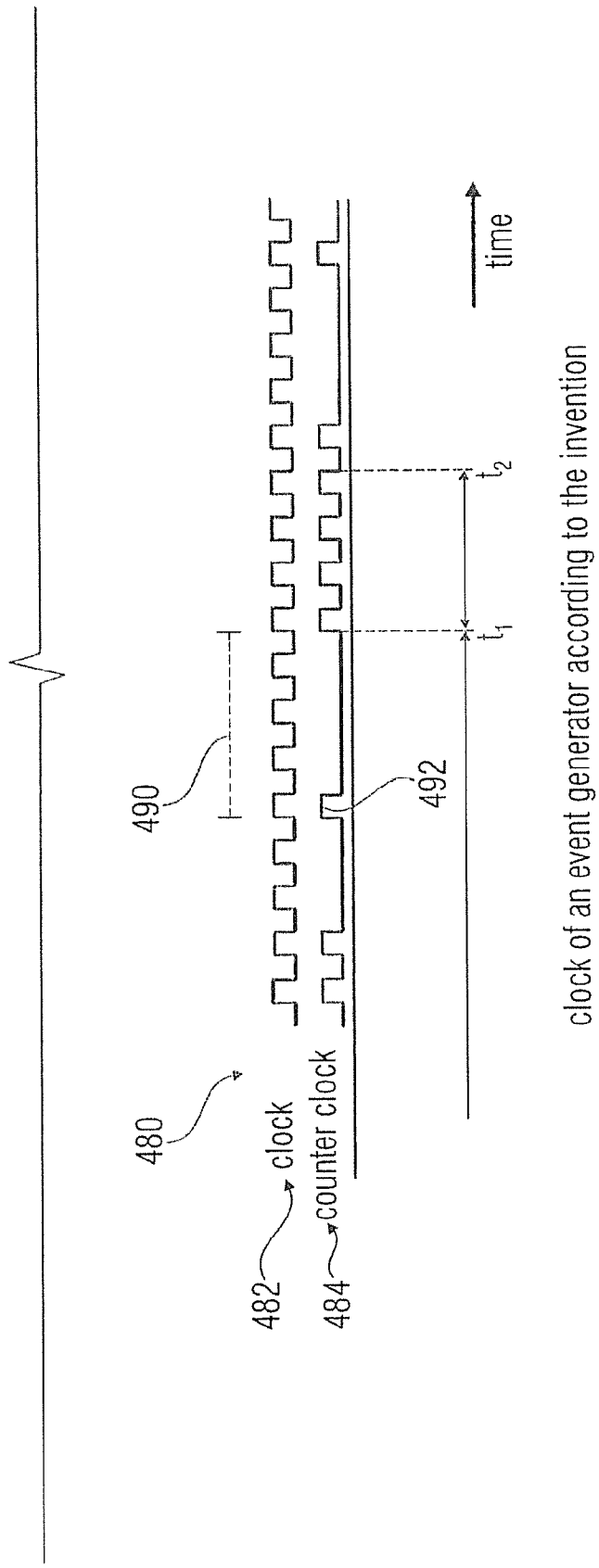

FIG. 4 shows a block diagram of an event generator, according to an aspect of the present disclosure, and a signal representation of a clock of an event generator.

The event generator 400 receives an input clock signal 410, which may, for example, but not necessarily, comprise a fixed frequency. Moreover, the event generator 400 typically receives an event time information 412, which may take the form of a binary encoded value. Also, the event generator 400 provides an event signal 420, wherein, for example, a pulse or edge of the event signal 420 describes an event.

The event generator 400 comprises a clock gating unit 440, which is configured to receive the input clock signal 410 and generate, a gated clock signal 442 based on the input clock signal 410. The clock gating unit 440 may, for example, receive a clock gating control signal 444. For example, the clock gating unit 440 may be configured to switchably pass either all clock pulses of the input clock signal 410, such that the gated clock signal 442 comprises the same frequency as the input clock signal 410 (high temporal resolution mode of operation), or to suppress (gate out) one or more pulses of the input clock signal 410, such that the frequency of the gated clock signals 442 is smaller than the frequency of the input clock signal 410 (low temporal resolution mode of operation). For example, the clock gating unit 440 may be configured to either pass every pulse of the input clock signal 410, or pass only one out of i pulses (for example, every i-th pulse) of the input clock signal 410 based on a state of the clock gating control signal 444. Thus, the frequency of the gated clock signal 442 can be switched between a comparatively higher value and a comparatively lower value based on the clock gating control signal.

The event generator 400 also comprises a counter 450, which receives the gated clock signal 442 as a counting clock. The counter 450 may, for example, be a synchronous counter. The counter 450 typically provides a sequence of count values 452, wherein the count value 452 provided by the counter 450 may change in response to an edge of the gated clock signal 442. The counter 450 also receives a counter step control signal 454. The counter 450 may be configured such that a counter step is selected based on the counter step control signal 454. Thus, the counter 450 may, for example, count up or count down with a step size of 1 in a high-temporal-resolution mode of operation, and may count up or count down with a step size of i in a low-temporal-resolution mode of operation. The mode of operation may be indicated by the counter step control signal 454.

The event generator 400 also comprises a comparator 460. The comparator 460 receives the sequence of count values 452 from the counter 450 and also provides the clock gating control signal 442 and the counter step control signal 454. Moreover, the comparator receives a coarse event time information 462 and a fine event time information 464 from an event splitter 470. The comparator 460 also provides the event signal 420.

Moreover, the event generator 400 comprises an event splitter 470, which provides the coarse event time information 462 and the fine event time information 464 based on the input event time information 412.

The comparator 460 is configured to evaluate a low-temporal-resolution count value (like, for example, a low-temporal-resolution portion of one or more count values provided by the counter 452), to detect a near occurrence of an event, and to evaluate a high-temporal-resolution count value (like, for example, a high-temporal-resolution portion of one or more of the count values 452 provided by the counter 450) in response to a detection of a near occurrence of an event, and provide the event signal based on the evaluation of the high-temporal-resolution count value. The comparator 460 is also configured to make use of the coarse event time information 462 and the fine event time information 464 when providing the event signal 420.

When the comparator 460 detects, for example based on a comparison between a low-temporal-resolution portion of one or more count values 452 and the coarse event time information 462 provided by the event splitter 470, that an event (a time of which is described by the event time information 412) will occur in the close future, the comparator signals to the counter 450 to use a small step size (high-temporal-resolution mode of operation of the counter 450). In this case, the comparator also signals to the clock gating unit to provide the gated clock signal 442 with a high frequency, i.e. to pass every pulse of the input clock signal 410 (high-temporal-resolution mode of operation of the clock gating unit 440). Thus, the comparator 460 effectively switches both the clock gating unit 440 and the counter 450 to the high-temporal-resolution mode of operation in response to the detection of a near occurrence of an event. Prior to the detection of the near occurrence of an event, the clock gating unit 440 and the counter 450 typically operate in a low-temporal-resolution mode of operation, which means that the clock gating unit 440 provides a gated clock signal 442 with a comparatively low frequency (for example, by gating out most of the pulses of the input clock signal 410), and which also means that the counter 450 counts with a comparatively large step size. Thus, it can be seen that the count values 452 provided by the counter 450 in the low-temporal-resolution mode of operation only constitute low-temporal-resolution count values since the step size of the counter 450 is larger than 1 and the gated clock signal 442 clocking the counter 450 has a comparatively low frequency. Consequently, an evaluation of one or more least significant bits of the count values 452 provided by the counter 450 may be omitted by the comparator 460, because the one or more least significant bits are meaningless (or at least of low relevance) in the low-temporal-resolution mode of operation of the clock gating unit 440 and of the counter 450. However, when the comparator 460 detects the near occurrence of an event based on the comparison between the low-temporal-resolution count values 452 and the coarse event time information 462, both the clock gating unit 440 and the counter are switched the high-temporal-resolution mode of operation. Accordingly, the count values 452 provided by the counter 450 in the high-temporal-resolution mode of operation have a high temporal accuracy and change more often per unit time (when compared to the low-temporal-resolution mode of operation). Accordingly, the comparator 460 typically considers the least significant bits of the count values 452 provided by the counter 450 in the high-temporal-resolution mode of operation. The comparator 460 typically compares a high-temporal-resolution count value with the fine event time information 464, and provides a pulse or edge of the event signal 420 in response to the high-temporal resolution count value being equal to the fine event time information 464. However, it should be noted that it is not necessary to evaluate the full count value 452 provided by the counter in the high-temporal-resolution mode of operation. Rather, it may be sufficient to evaluate a portion thereof comprising one or more of the least significant bits, because the least significant portion actually carries the relevant high-temporal-resolution information (while the more significant portion carries the low-temporal-resolution information, which may already have been evaluated when detecting the near occurrence of an event). In other words, those more significant bits which have already been evaluated for detecting the near occurrence of an event do not necessarily need to be re-evaluated when performing a high-temporal-resolution comparison.

Thus, it may be sufficient that the comparator 460 compares a portion of the count value 452 comprising one or more least-significant bits with the fine event time information 462 to determine the actual time of the event and to thereby provide a pulse or edge of the event signal. However, the comparator 460 may, alternatively, compare the full count value 452 with a "full" event time information 412 subsequent to the detection of the near occurrence of an event.

It should also be noted that the coarse event time information 462 and the fine event time information 464 may be non-overlapping portions of a digital representation (for example, a binary coded representation) of the event time information 412. Alternatively, however, the coarse event time information 462 and the fine event time information 464 may be overlapping portions of a digital representation of the event time information 412. Accordingly, the coarse event time information 462 is compared with the corresponding portion of the count values 452 provided by the counter 450 in the low-temporal-resolution mode of operation (i.e., prior to the detection of a near occurrence of an event), and the fine event time information 464 may be compared with a corresponding portion of the count values 452 provided by the counter in response to (i.e., subsequent to) the detection of the near occurrence of the event. Thus, the coarse event time information 462 may serve to determine the near occurrence of the event, and the fine event time information 464 may be used to determine the actual (precise) time of the event.

To further facilitate the understanding, the timing of the counter clock signal will be explained taking reference to a graphic representation 480 of the input clock signal 410 and of the gated clock signal 442. A first signal representation 482 describes the input clock signal. A second signal representation 484 describes the gated clock signal 442. As can be seen, the clock gating unit 440 and the counter 450 are operated in a low-temporal-resolution mode of operation in a time period up to a time t1. In the time period up to time t1, the frequency of the counter clock (gated clock signal) 442 is only one fourth of the frequency of the input clock signal 410 (also briefly designated with "clock"). In other words, only one out of four clock pulses of the input clock signal 410 is passed by the clock gating unit 440, while three out of four clock pulses of the input clock signal 410 are gated out (blocked) by the clock gating unit 440. Thus, the counter 450 counts with a count rate (number of count operations per unit time) of only one fourth of the frequency of the input clock signal. However, at some time within the time period 490, the near occurrence of an event is detected. This detection of the near occurrence of an event may be based on the finding that the count value reached by a clock pulse 492 (or a most significant portion of said count value) coincides with an event time described by the coarse event time information 462. Accordingly, the comparator 460, which detects the near occurrence of an event, switches both the clock gating unit and the counter to the high-temporal-resolution mode of operation. For example, the clock gating unit is switched at time t1, or shortly before time t1, to a mode in which all clock pulses of the input clock signal 410 are passed through. This switching may be effected by the clock gating control signal 444. Similarly, the counter 450 may be set, using the counter step control signal 454, to a small count step, for example, a count step of 1, at time t1 or shortly before time t1, but typically less than one clock cycle before time t1. Accordingly, both the clock gating unit 440 and the counter 450 may operate in a high-temporal-resolution mode of operation between times t1 and t2. The counter 450 may count up or count down at a (comparatively) high clock rate defined by the gated clock signal 442, but with a small step size (for example, of 1). Accordingly, the count values 452 provided between times t1 and t2 comprise a particularly high temporal-resolution and may be evaluated by the comparator 460 to determine an actual time of an event. The actual event may, for example, lie somewhere between times t1 and t2. At the time t2, the comparator 460 may switch back the clock gating unit 440 and the counter 450 to the low-temporal-resolution mode of operation. Accordingly, the frequency of the gated clock signal 442 is reduced again.

To further facilitate the understanding, a temporal evolution of the count values, and also of the other relevant signals, will be described taking reference to FIG. 5.

Figure 5:
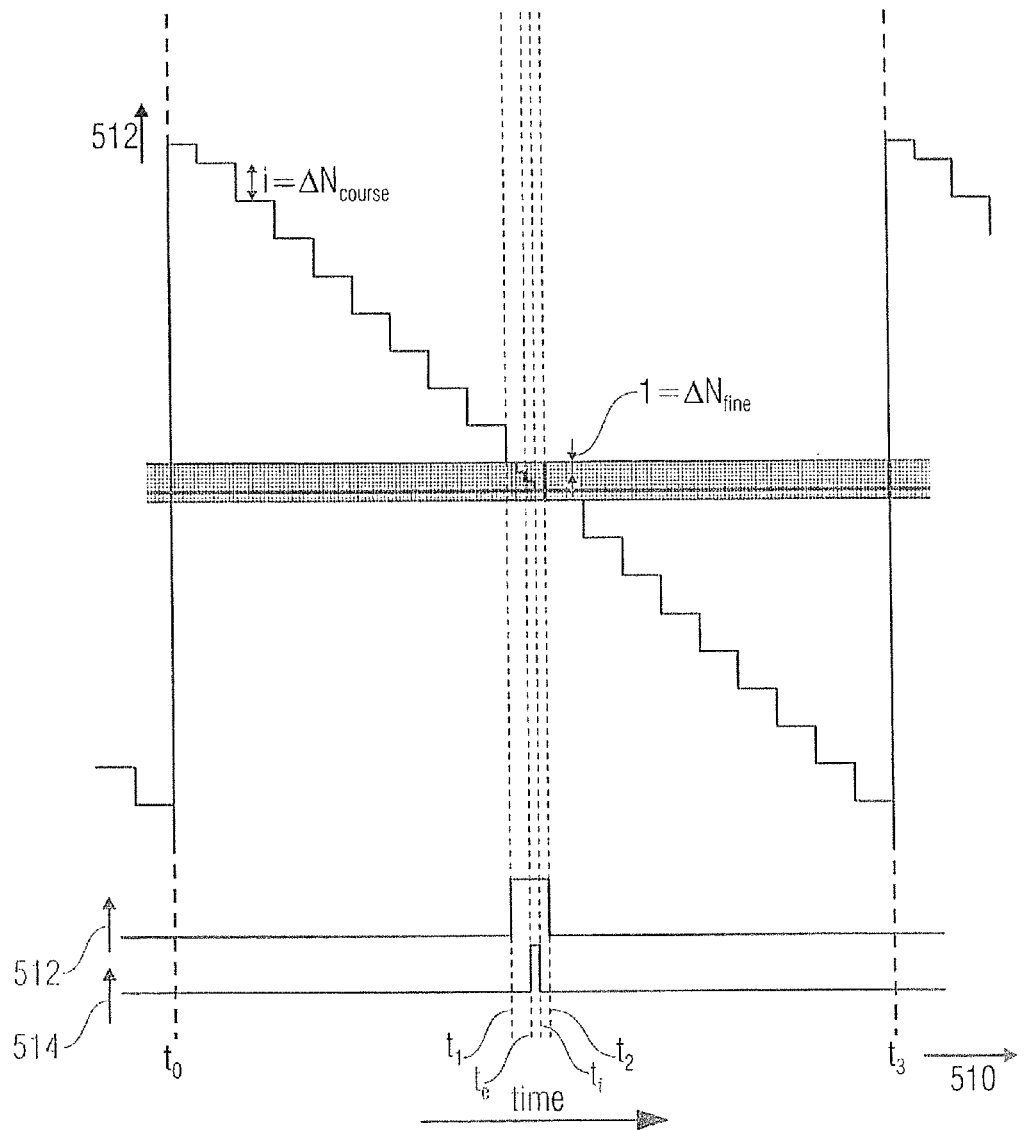
FIG. 5 shows a schematic representation of count values over time which occur in one aspect of the present disclosure.

FIG. 5 shows a graphic representation of a count value of the counter 450, of a state of the clock gating control signal 444, of a state of the counter step control signal 454 and of the event signal 420. An abscissa 510 describes the time. An ordinate 512 describes the count values 452 provided by the counter 450. An ordinate 514 describes a state of the clock gating control signal 444 and of the counter step control signal 454, and an ordinate 514 describes a state of the event signal 420. In other words, FIG. 5 shows the operation of a digital event generator such as a DPWM counter according to the invention. High rate and accuracy is used only in the vicinity of an event (i.e., near the occurrence of an event), as will be described in more detail in the following.

As can be seen, the counter is set to an initial value at a time t0. Subsequently, the counter counts down between the times t0 and t1. For example, the counter counts down with a step size of 4 (or, more generally, a step size of i) between times t0 and t1. For example, the counter 450 may count down once per i pulses of the input clock signal 410.

However, at time t1, or shortly before time t1, or shortly after time t1, the near occurrence of an event may be detected. For example, a comparison of the count value present immediately before time t1 with a coarse event time information 462 may indicate the near occurrence of an event. Alternatively, however, a comparison between the count value reached at the time t1 with the coarse event time information 462 may indicate the near occurrence of an event. Accordingly, the clock gating control signal 444 and the counter step control signal 454 are activated at time t1, which indicates, for example, that the gating out of clock pulses of the input clock signal 410 should be deactivated (such that, for example, all clock pulses of the input clock signal 410 are passed through to the gated clock signal 442), and that the step size of the counter 450 should be decreased (for example, down to a minimum step size of 1). Accordingly, both the clock gating unit 440 and the counter 450 are in a high-temporal-resolution mode of operation between times t1 and t2. As can be seen, the counter counts down with increased counting frequency (for example, once per pulse of the input clock signal 410) and reduced step size (for example, to a step size of 1). Thus, the count values provided by the counter 450 between times t1 and t2 have a higher temporal resolution and are more accurate.

At time t2, the clock gating control signal 444 and the counter step control signal 454 are deactivated again, thereby switching both the clock gating unit 440 and the counter 450 back to the low-temporal-resolution mode of operation. The deactivation of the clock gating control signal 444 and of the counter step control signal 454 at time t2 may, for example, be effected by the detection that a predetermined number of pulses of the input clock signal 410 have occurred since the switching to the high-temporal-resolution mode of operation. However, other mechanisms may also be used for deactivating the clock gating control signal 444 and the counter step control signal 454.

As can be seen, between times t1 and t2, a counter step size $\Delta N$ is reduced, for example, down to $\Delta N_{fine}=1$, when compared to a counter step size $\Delta N_{coarse}$ between times t0 and t1. Thus, the counter value decreases in smaller steps between times t1 and t2 than between times t0 and t1. However, between times t1 and t2, a count rate (number of count operation per unit time) is increased when compared to a count rate between times t0 and t1. Accordingly, count values with a higher temporal resolution are provided between times t1 and t2 when compared to the count values provided between times t0 and t1. Count values provided between times t1 and t2, or at least high-temporal-resolution portions thereof, are compared with an event time information (or at least a high-temporal-resolution portion thereof).

As can be seen in FIG. 5, the comparator detects, at time te, that the (high-temporal-resolution) count value of the counter reaches a value defined by the event time information (or a high-temporal-resolution portion thereof). Accordingly, the event signal is activated. At time tf, the count value of the counter changes (decreases) again, such that the count value of the counter is no longer equal to a count value defined by the event time information (or a high-temporal-resolution portion thereof). As a consequence, the comparator deactivates the event signal again, such that a short pulse of the event signal is provided between times te and tf.

As mentioned before, at time t2, the counter and the comparator switch back to the low-temporal-resolution mode of operation. The switch back may, for example, be based on the fact that the comparator finds out that a predetermined time has elapsed since time t1, i.e., since the switching towards the high-temporal-resolution mode of operation. For example, the comparator may find out that a low-temporal-resolution portion of the count value differs from a low-temporal-resolution portion of a time described by the event time information. In other words, if the comparator finds that a low-temporal-resolution portion of the count value is different from a low-temporal-resolution portion of the event time information (or of more than one digital event time information items), the counter may initiate a switch back to the low-temporal-resolution mode of operation. Stated differently, the switch back to the low-temporal-mode of operation may be performed when the comparator finds out that a near occurrence of an event is not expected.

Subsequent to the time t2, the counter counts down at a low count rate (i.e., at a low number of count operations per unit time), for example, at the same count rate which is used during times t0 and t1. Also, the count step is increased again when switching back to the low-temporal-mode of operation at time t2. For example, the count step may be switched back to the same count step which is used between times t0 and t1 at time t2. Switching back to the low-temporal-resolution mode of operation is signaled by a deactivation of the clock gating control signal 444 and the counter step control signal 454. Accordingly, the counter counts, for example, counts down, from time t2 until a predetermined minimum count value is reached at time t3. The minimum count value may be a predetermined value and may be defined arbitrarily. Alternatively, however, the minimum count value may be defined by a counter under-run (or counter over-run). Upon detection that the minimum count value is reached, the counter may be reset to a starting value, such that a cyclic counting process is reached. Alternatively, the counter may count to the starting value by a counter under-run (or counter over-run). However, the minimum count value may be varied by a control circuit to thereby vary a duration of a count cycle.

In an alternative implementation, the counter may count (for example, count down) at a third count rate, which is different from the count rates between times t0 and t1 and between times t1 and t2, In other words, a first count rate (frequency_1) and a first count step (decrement_1) may be used between times t0 and t1, a second count rate (frequency_2) and a second count step (decrement_2) may be used between times t1 and t2, and a third count rate (frequency_3) and a third count step (decrement_3) may be used between times t2 and t3. Thus, three or even more different count rates may be used, which may bring advantages if, for example, different temporal resolutions are required for providing a first event signal and one or more subsequent event signals within a count cycle.

It should be noted that it is possible to switch to a high-temporal-resolution mode of operation multiple times during a cycle of the counter, i.e., between times t0 and t3. Accordingly, the event signals (pulses or edges of the event signal) may be provided for a plurality of events during a count cycle. Also, multiple event signals (pulses or edges of the event signal) may be provided in response to a single switching from the low-temporal-resolution mode of operation to the high-temporal-resolution mode of operation.

Figure 6:
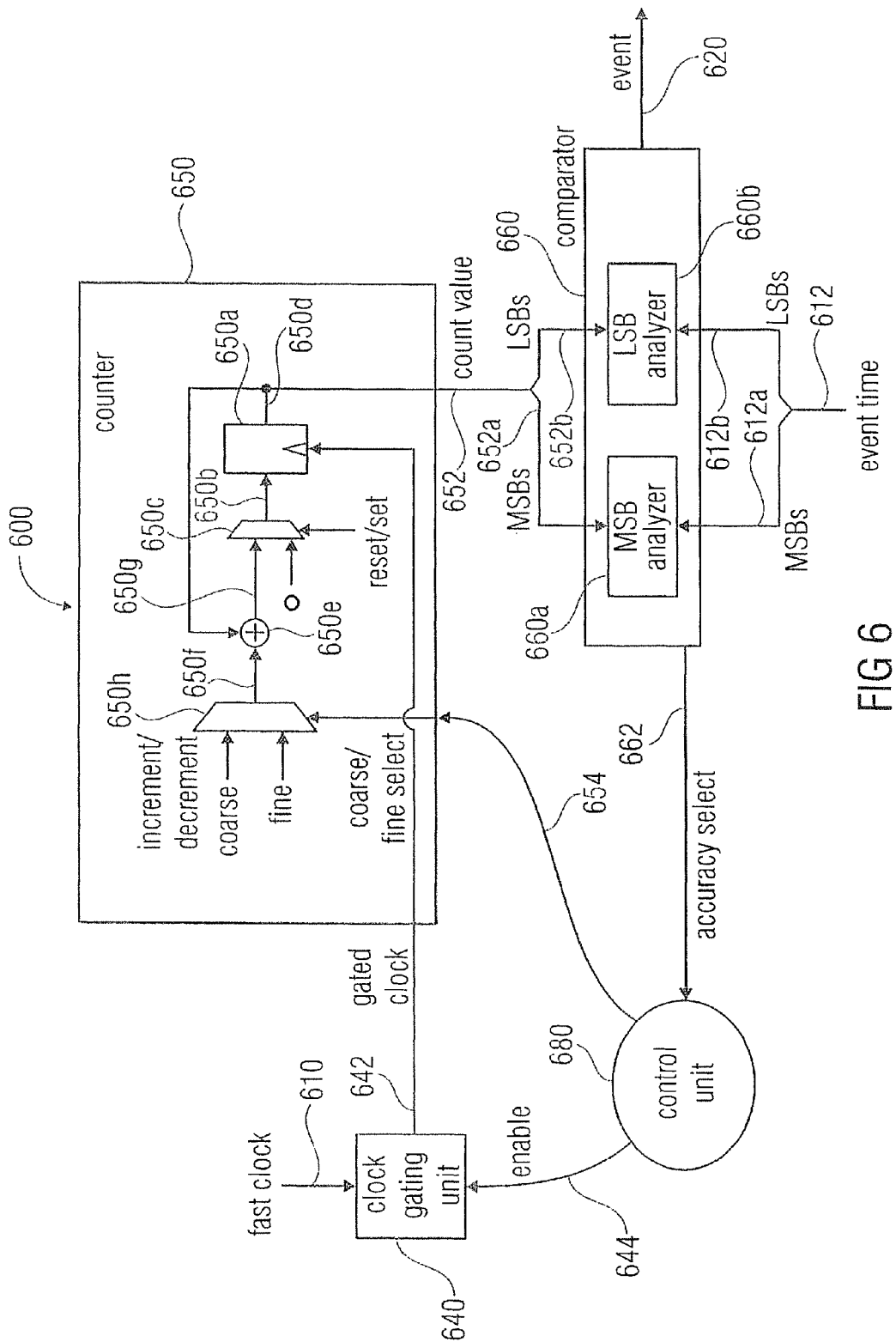
FIG. 6 shows a block schematic diagram of a digital event generator, according to one aspect of the present disclosure.

FIG. 6 shows a block schematic diagram of an event generator, according to an embodiment of the invention. The event generator 600 is configured to receive an input clock signal 610, which is also designated as "fast clock". Also, the event generator receives an event time information 612, which typically comprises a portion of more-significant bits and a portion of less significant bits. The event time information 612 may be encoded in digital form, for example, in a binary form or in a binary-coded-decimal form. Moreover, the event generator 600 provides an event signal 620, a pulse or edge of which may, for example, describe the event. In other words, the time of the event is described by the time at which a pulse or an edge of the event signal 620 occurs.

The event generator 600 comprises a clock gating unit 640 which receives the input clock signal 610 (fast clock) and an enable signal 644. The clock gating unit 640 provides a gated clock signal 642, wherein a clock gating is performed by the clock gating 640 if the clock gating enable signal 644 is active.

The event generator 600 also comprises a counter 650, which is configured to receive the gated clock signal 642 and a coarse/fine select signal 654, which may also be considered as a counter step control signal. The counter 650 provides a sequence of count values 652. The counter 650 may, for example, comprise a clocked multi-bit register 650a, which receives an input value 650b from a switch (or multiplexor) 650c and which takes over and stores the input value 650b provided at its input in response to the gated clock signal 642 (for example, in response to an edge of said gated clock signal 642). Accordingly, the multi bit register 650a may comprise a plurality of one-bit latches or flip-flops which are clocked with the same clock signal, namely the gated clock signal 642. The multi-bit register 650a provides an output value 650d, which is a latched version of its input value 650b. The output value 650d may be a multi-bit value which represents the count value 652. The output value 650d may be fed back to an adder or subtractor 650e, which adds a step value 650f to the output value 650d or which subtracts the step value 650f from the output value 650d of the multi-bit latch 650a, to thereby provide an updated value 650g. The step value 650f may be provided to the adder or subtractor 650e from a switch or multiplexer 650h, which selectively provides a comparatively large step value (increment value or decrement value), which is also designated as "coarse" value, or a comparatively small step value (increment value or decrement value) which is also designated as a "fine value", based on a state of the coarse/fine select signal 654. In other words, the step value 650f takes a comparatively small value (for example, a value of i=1) or a comparatively large value (for example, a value of i>1) in dependence on the coarse/fine select signal 654. The switch or multiplexer 650c selectively provides the updated value 650g or a reset value, for example, a reset value of 0, as the input value 650b to the multi-bit latch 650a in dependence on a reset signal or a set signal. Alternative to the reset value, the switch or multiplexer 650c may selectively provide a desired reload value in the case that the counter is set to a reload value once per cycle. Accordingly, the count value 652 is incremented or decremented by the currently selected step value 650f in response to each pulse or edge of the gated clock signal 642 unless the set signal or reset signal is active. If the set signal or reset signal is active, the count value 652 is set or reset to take the reset value applied to the switch or multiplexer 650c.

The event generator 600 also comprises a comparator 660 which receives the event time information 612 and the count value 652. The comparator 660 provides, based thereon, the event signal 620 and an accuracy select signal 662. The comparator 660 comprises, for example, a more-significant-bit-analyzer 660a and a less-significant-bit-analyzer 660b. The more-significant-bit-analyzer 660a may, for example, receive a subset of more-significant-bits 652a of the count value 652 and a subset of more-significant-bits 612a of the event time information 612. Accordingly, the more-significant-bit-analyzer 660a may compare the subset 652a of more-significant-bits of the count value 652 (which may be considered as a low-temporal-resolution portion of the count value 652) and the subset 612a of more-significant-bits of the event time information 612, which may be considered as a low-temporal-accuracy portion of the event time information 612. In response to said comparison, the more-significant-bit-analyzer 660a may provide a signal which indicates a near occurrence of an event. In other words, the occurrence of an event may be signaled if the bits of the subset 652a of the bits of the count value 652 are identical to the bits of the subset 612a of the event time information 612. Accordingly, the accuracy select signal 662 will be provided to indicate a high accuracy (high temporal resolution) if the more-significant-bit-analyzer 660a recognizes a coincidence of the values represented by the more-significant-bits of the count value 652 and the more-significant-bits of the event time information 612. Moreover, the least-significant-bits analyzer 660b is typically configured to compare the least-significant-bits of the count values 652 with the least-significant-bits 612b of the event time information 612. In other words, a high-temporal-resolution portion 652b of the count values 652 is compared with a high-temporal-resolution portion of event time information 612 by the least-significant-bits analyzer 660b, and the comparator 660 provides a pulse or edge of the event signal 620 in response to a coincidence of the least-significant-bits 652 of the count value 652 with the least-significant-bits 612b of the event time information 612, provided that the near occurrence of an event has been detected (i.e., there has been a coincidence between the most-significant bits 652 of the count value and the most-significant bits 612a of the event time information 612 detected in a previous low-temporal resolution comparison performed by the most-significant-bits analyzer 660a).

The event generator 600 also comprises a control unit 680 which is configured to receive the accuracy select signal 662 from the comparator 660 and which provides, based thereon, the enable signal 644 and the coarse/fine select signal 652. For example, the clock gating may be disabled if the accuracy select signal 662 indicates that a high temporal accuracy mode of operation is desired, and the periodic clock gating may be enabled (to gate out pulses of the fast clock signal 610) if the accuracy select signal 662 indicates that a low temporal resolution is desired. For example, one out of i clock pulses may be passed to the counter if the (periodic) clock gating is enabled. In other words, the clock is typically not completely gated out when the clock gating is enabled. Similarly, the coarse/fine select signal 654 may be set to indicate a fine count step if a high-temporal-resolution or fine mode of operation (also designated as high-temporal-accuracy mode) is desired and to indicate a comparatively larger count step if a low-temporal-resolution or coarse mode of operation (also designated as low-temporal-accuracy mode) is desired.

It should also be noted that the most-significant-bit-analyzer 660a may be used to detect the near occurrence of an event, wherein a switching towards the high-accuracy mode of operation is performed in response to the detection of the near occurrence of an event. The least-significant-bits analyzer 660b may be inactive in the low-temporal-accuracy mode of operation, and may be activated in the high-temporal-accuracy mode of operation, i.e., in response to the detection of the near occurrence of an event. In contrast, the most-significant-bits-analyzer 660a may continue to operate in the high-temporal-resolution mode of operation to determine the time at which the high-temporal-resolution mode of operation is to be left (by switching back to the low-temporal-resolution mode of operation). For example, when the most significant bits 652a of the count value 652 no longer coincide with the most significant bits 612a of the event time information 612, a switch back towards the low-temporal-accuracy mode of operation may be performed.

Moreover, it should be noted that the event generator 600 may fulfill the functionality of the event generator 100 and/or of the event generator 400. However, the additional optional improvement discussed herein may also be applied to the event generator 600.

Figure 7:
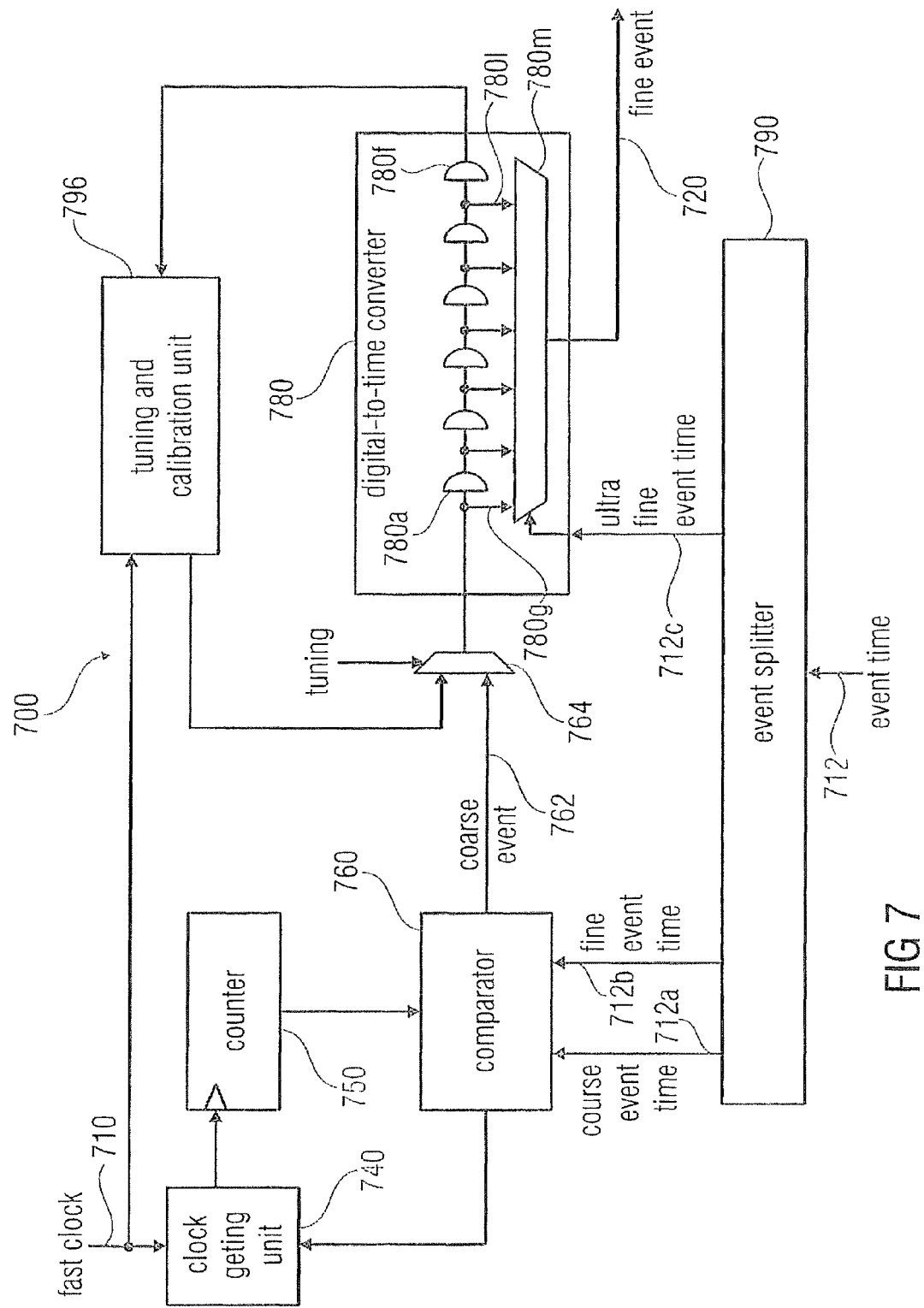
FIG. 7 shows a block schematic diagram of a digital event generator, according to another aspect of the present disclosure.

FIG. 7 shows a block diagram of an event generator, according to another embodiment of the invention. The event generator 700 is similar to the event generator 600, such that identical means and signals will not be described here again.

The event generator 700 receives an input clock signal (fast clock) 710 which is equivalent to the input clock signal 610. Moreover, the event generator 700 receives an event time information 712, which is similar to the event time information 612, but which may comprise an even higher temporal resolution. Also, the event generator 700 provides an event signal 720 which is similar to the event signal 620 but which may comprise a higher temporal resolution.

The event generator 700 comprises a clock gating unit 740 which is equivalent to the clock gating unit 640. The event generator 700 comprises a counter 750 which may be equivalent to the counter 650. Also, the event generator 700 comprises a comparator 760, which may be equivalent to the comparator 660. However, the comparator 760 receives a coarse event time information 712a, which may be equivalent to the low-temporal-resolution portion 612a of the event time information 612, i.e., to the most significant bits of the event time information 612. In addition, the comparator 760 receives fine event time information 712b which may be equivalent to the high-temporal-resolution portion 612b of the event time information 612, i.e., to the least significant bits of the event time information 612. The comparator 760 provides a (comparatively) coarse event signal 762, which may be equivalent to the event signal 620 provided by the comparator 660.

In addition to the elements of the event generator 600, the event generator 700 further comprises a timing fine adjustment circuit which receives the coarse event signal 762 and which provides, based thereon, the fine event signal 720, such that a timing adjustment accuracy of the fine event signal 720 is increased when compared to a timing adjustment accuracy of the coarse event signal 762. For example, the event generator 700 comprises a digital-to-time converter 780, which receives the coarse event signal 762 via a multiplexor or switch 764 in a normal mode of operation of the digital-to-time converter 780. Moreover, the digital-to-time converter provides the fine event signal 720 based on the coarse event signal 762 in the normal mode of operation. Also, the digital-to-time converter 780 receives an ultra fine event time information 712c, which determines a timing of the fine event signal 720 (or more specifically, of a pulse or edge thereof) when compared to the coarse event signal 762 (or, more specifically, a pulse or edge thereof).

The event generator also comprises an event splitter 790 which receives the event time information 712 and splits up the event time information 712 into a plurality of components, namely into the coarse event time information 712a, the fine event time information 712b and the ultra fine event time information 712c. Accordingly, the coarse event time information 712a may be a low-temporal-resolution portion of the event time information 712, for example, a subset of most-significant bits of the event time information 712. Moreover, the fine event time information 712 may be a medium-temporal-accuracy portion of the event time information 712, for example, a subset of medium-significant-bits of the event time information 712 (i.e., a subset of bits which do not comprise one or more of the most significant bits and which do not comprise one or more of the at least significant bits of the event time information). Moreover, the ultra fine event time information 712c may be a high-temporal-resolution portion of the event time information 712, i.e., may comprise a subset of least-significant-bits of the event time information 712. Accordingly, the event time splitter 790 may split up the event time information 712 into three components 712a, 712b, 712c of different temporal accuracy. In the case of a binary encoding of the event time information 712, the event splitter may split up the event time information in different non-overlapping portions of the binary representation, such that the coarse event time information 712a comprises a subset of most significant bits and such that the ultra-fine event time information 712 comprises a subset of one or more at least significant bits.

The digital-to-time converter 780 may, for example, comprise a chain of delay elements 780a to 780f which are circuited in series and which may also be designated as a delay line in their entirety. The chain of delay elements (delay line) comprises a number of taps 780g to 780l. A first delay element of the chain of delay elements receives the coarse event signal 762 via the switch (or multiplexer) 764 in a normal mode of operation. The digital-to-time converter 780 also comprises a selector 780m which selects one of the taps of the chain of delay elements (also designated as tapped delay line), and to provide the fine event signal 720 on the basis of the signal present at the selected tap of the tapped chain of delay elements (tapped delay line). Accordingly, a number of delay elements of the tapped chain of delay elements, which are switched between the output of the comparator 760 and the output for the fine event signal 720, is adjusted based on the ultra fine event time information 712c. By using a tapped delay line, a particularly high temporal resolution can be obtained. In other words, the temporal resolution of the (comparatively coarse) event signal 762 can be further improved by adjusting the delay between the coarse event signal 762 and the fine event signal 720 based on the ultra fine event time information 712c. An advantage of the coarse fine splitting is that less coarse events are injected into the digital-to-time converter, thus the power consumption in the latter one is reduced.

It should be noted that the event generator 700 may also comprise a tuning and calibration unit 796. The tuning and calibration units 796 may, for example, receive the input clock signal 710 (fast clock). Moreover, the tuning and calibration unit 796 may provide an input signal to the digital-to-time converter 780 (or, more precisely, to the tapped chain of delay elements thereof) via the switch (or multiplexer) 764 in a tuning mode of operation of the digital-to-time converter 780. In this case, the tuning and calibration unit 796 may also receive an output signal of the tapped chain of delay elements. Accordingly, the tuning and calibration unit may, for example, determine an overall delay of the chain of delay elements, or an information based thereon. Accordingly, a calibration information may be provided, which is used to select a proper tap of the chain of delay elements based on the ultra fine event time information 712c or to tune the delay of the delay elements.

To summarize, the event generator 700 may improve the timing accuracy of the fine event signal 720 (when compared to a timing accuracy of the (comparatively) coarse event signal 762) using the digital-to-time converter 780, which may receive an ultra fine event time information 712c obtained (for example, split-off) from the overall event time information 712 using the event splitter 790. Optionally, a calibration of the digital-to-time converter 780 may be performed by the tuning and calibration unit 796 in a calibration mode of operation.

Thus, a timing accuracy may be provided which is even higher than a period time of the input clock signal 710 (wherein, for example, a timing accuracy of the coarse event signal 762 may be equal to (or of the order of) a period time of the input clock signal 710).

Figure 8:
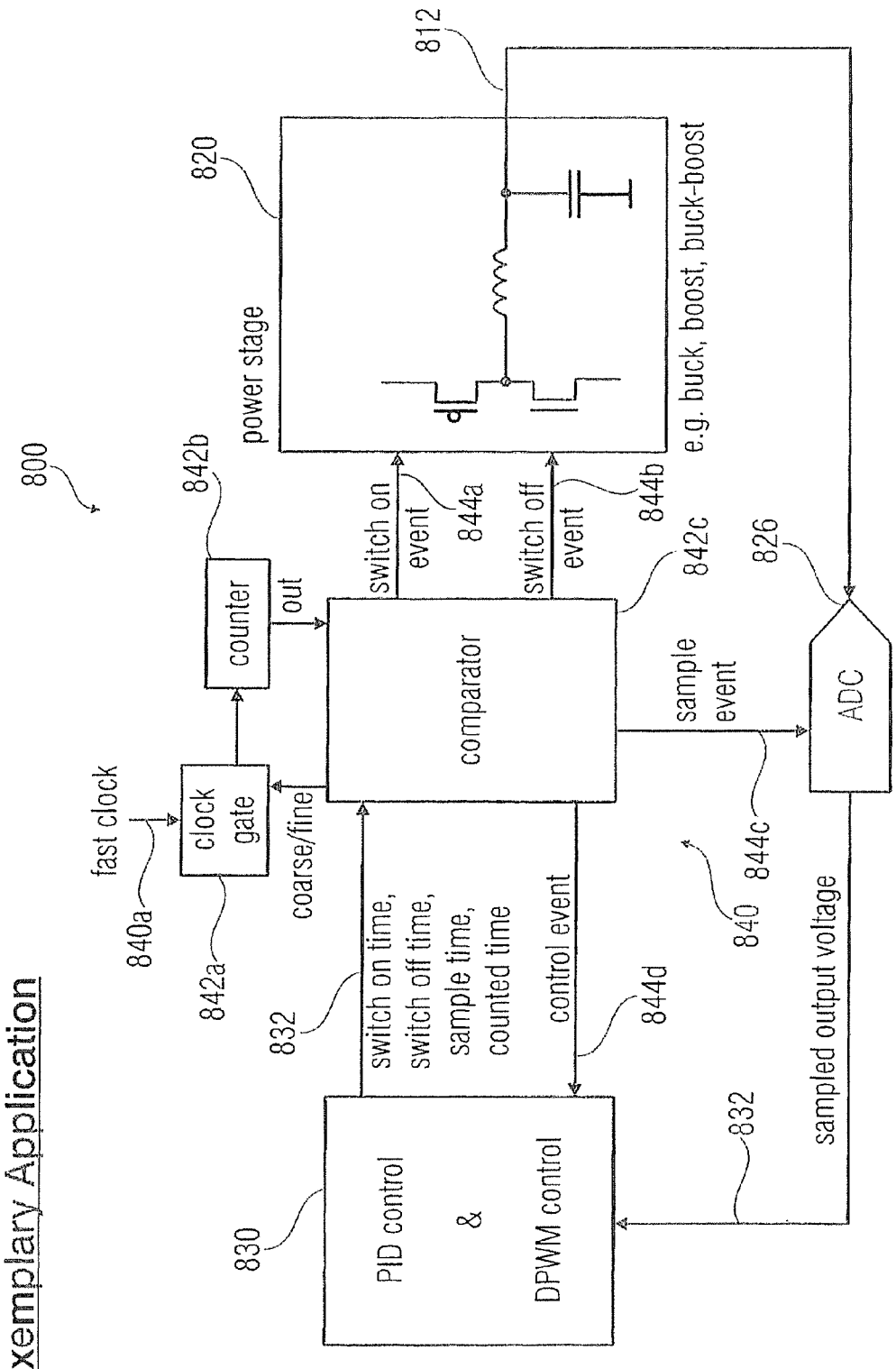
FIG. 8 shows a block schematic diagram of an energy converter, according to one aspect of the present disclosure.

FIG. 8 shows a block schematic diagram of an energy converter, according to an embodiment of the invention. The energy converter 800 according to FIG. 8 is similar to the energy converter 300 according to FIG. 3.

The energy converter 800 receives an electrical input energy and provides, based thereon, an electrical output quantity 812, for example, an electrical output voltage or an electrical output current.

The energy converter 800 comprises a power stage 820 configured to provide the electrical output quantity 812 based on the electrical input energy. The power stage may, for example, comprise a buck converter, a boost-converter or a buck-boost converter. However, other switched mode circuits may also be used. The energy converter 800 also comprises a digital control circuit 830 which may be configured to receive a digital information 832 representing a sampled output voltage (or a sampled output current) via an analog-digital-converter 826. An input of the analog-digital-converter 826 is, for example, coupled to an output (or, alternatively, to an intermediate node) of the power stage 820. For example, the analog-digital-converter 826 may sample an output voltage of the power stage to provide the sampled output voltage information 832.

The digital control circuit 830 may, for example, comprise a proportional-integral-differential control (PID control) and a digital pulse width modulation control. However, other types of regulator (other than a PID control) may also be used. The digital control circuit 830 provides, using the digital pulse width modulation control, a digital information representing a switch-on-time of a switch of the power stage and/or a switch-off-time of a switch of the power stage and/or a sample time of the analog-to-digital converter and/or any other control time (describing, for example, a time at which a control event should occur). The digital information describing the switch-on time and/or the switch-off time and/or the sample time and/or the control time may be considered as a digital event time information 832.

The energy converter 800 also comprises a digital event generator 840, which receives an input clock signal (fast clock) 840a and the digital event time information 832. The digital event generator 840 comprises a clock gate 842a, a counter 842b and a comparator 842c. The clock gate 842a may be equivalent to the clock gate 116 or the clock gate 440, and the counter 842b may be equivalent to the counter 130 or the counter 450. The comparator 842c may be equivalent to the comparator 140 or the comparator 460. Also, the interaction of the clock gate 842, the counter 842b and the comparator 842c may be as described above. However, the comparator 842c may provide a switch-on event signal 844a, a switch-off event signal 844b, a sample event signal 844c and a control event signal 844d. A timing of the switch-on event signal 844a may be defined by the switch-on time information, a timing of the switch-off event signal 844b may be defined by the switch-off time information, a timing of the sample event signal 844c may be defined by the sample time information, and a timing of the control event signal 844d may be defined by the control time information. In other words, the comparator may be configured to provide a plurality of event signals for the plurality of digital event time values describing the switch-on time, the switch-off time, the sample time and the control time.

In other words, the digital event generator 840 may be configured to provide a plurality of event signals 844a, 844b, 844c, 844d based on the plurality of digital event time values 832. Typically, some of the events may be in close temporal proximity, such that some of the event signals 844a, 844b, 844c, 844d are provided as a result of a single switching from the low-temporal-resolution mode of operation to the high-temporal-resolution mode of operation.

By using the digital event generator 840, as described herein, in the energy converter 800, a high efficiency of the energy converter 800 can be achieved even at low load conditions. However, it should be noted that the digital event generator described herein can be used in many different applications as well.

In the following, a method according to an embodiment of the invention will be described taking reference to FIG. 9, which shows a flow chart of the method 900.

The method 900 comprises providing 910 count values based on a clock signal. It should be noted that providing 910 the count values may be performed in parallel with the other steps described in the following.

The method 900 also comprises evaluating 920 a low-temporal-resolution count value to detect an near occurrence of an event. A determination, for example, in the form of a comparison, is performed to decide whether a near occurrence of an event is detected or not. If a near occurrence of an event is not detected, step 920 is repeated, as indicated at reference numeral 924.

However, if the near occurrence of an event is detected, a high-temporal-resolution count value is evaluated subsequently (step 940). Accordingly, it is determined, for example, using a comparison 944, as to whether an event is detected or not. If an event is not detected, the step 940 of evaluating a high-temporal-resolution count value is repeated.

However, if an event is detected, an event signal is provided (step 960).

In other words, the evaluation of a low-temporal-resolution count value is repeated until a near occurrence of an event is detected. If such near occurrence of an event is detected, one or more high-temporal-resolution count values are evaluated, until the actual event is detected. When the actual event is detected, an event signal (or a pulse or transition thereof) is provided.

Figure 9:
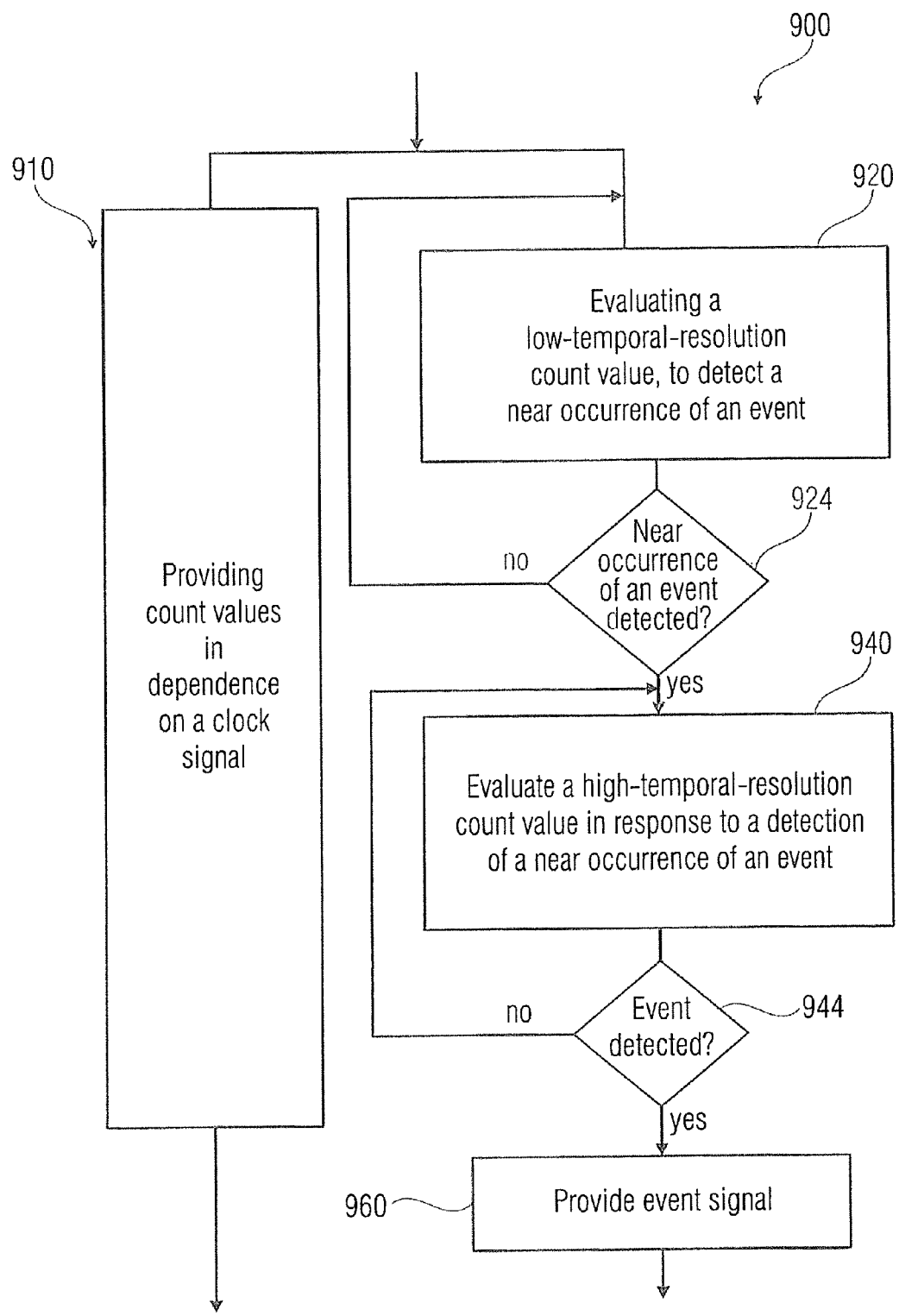
FIG. 9 shows a flow chart of an exemplary method for providing an event signal based on a digital event time information, according to one aspect of the present disclosure.

It should be noted that the method 900 according to FIG. 9 can be supplemented by any of the features and functionalities described herein. For example, such features and functionalities described with respect to the apparatuses may also be introduced into the method 900.

In the following, a reference example will briefly be described taking reference to FIGS. 10 and 11.

Figure 10:
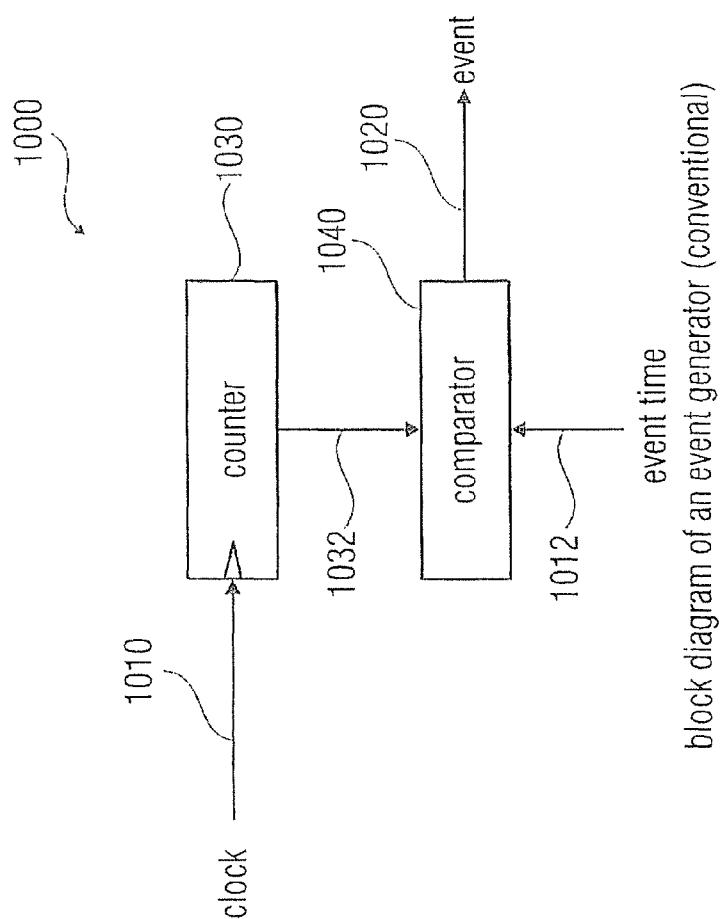
FIG. 10 shows a block schematic diagram of a conventional event generator.
Figure 10:
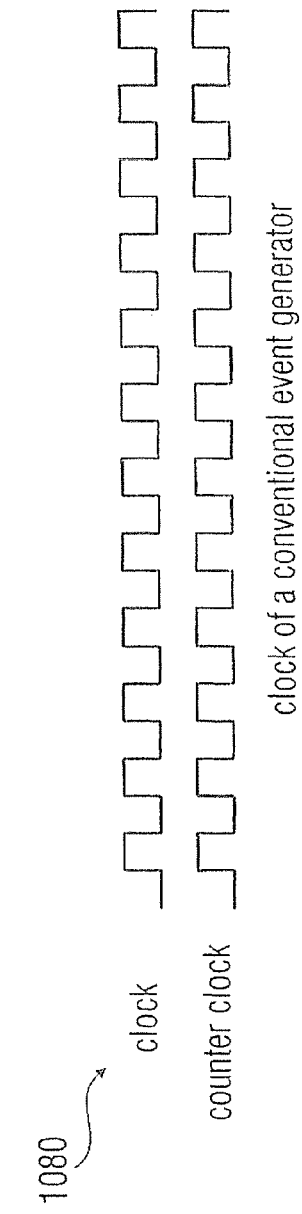
Figure 11:
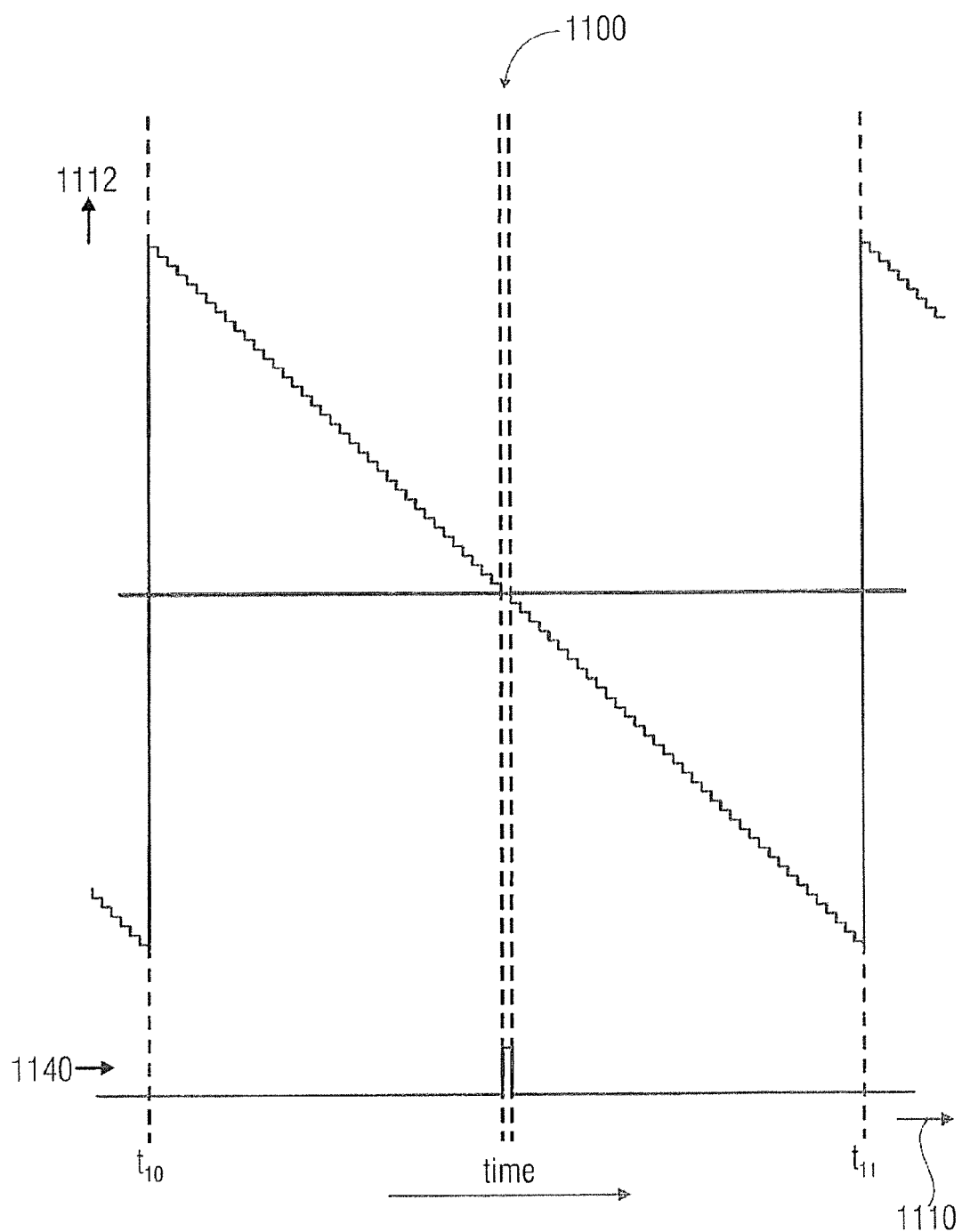
FIG. 11 shows a schematic representation of a temporal evolution of count values, which occurs in a conventional event generator.

FIG. 10 shows a block schematic diagram of a conventional event generator according to a reference example. The event generator 1000 receives an input clock signal 1010 and an event time information 1012. The event generator 1000 provides an event signal 1020 based thereon. The event generator 1000 comprises a counter 1030 which receives the input clock signal 1010 at a clock input in which provides a sequence of count values 1032 to a comparator 1040. The comparator also receives the event time information 1012 and compares the count values 1032 with the event time information 1012. When it is found by the comparator 1040 that the count value is equal to the event time information 1012, the comparator provides a pulse or edge of the event signal 1020. As can be seen in a signal representation 1080, a counter clock, according to which the counter 1030 counts, is equal to the input clock 1010. Thus, the counter counts at every rising edge or at every falling edge of the input clock signal 1010.

Accordingly, in order to receive a high timing accuracy, the counter 1030 must be made to permanently count with very high counting frequency. This brings along a high energy consumption.

Taking reference now to the graphical representation 1100 of the count values of the counter, the temporal evolution of said count values can be seen. An abscissa 1110 describes a time and an ordinate 1112 describes a count value. As can be seen, the counter counts down from a start value between times t10 and t11. A pulse of the event signal, a temporal evolution of which is shown at reference numeral 1140, is generated when the count value reaches a value described by the event time information.

However, it can be seen that the counter counts down with a high counting frequency (number of count steps per time unit) and comparatively small step size. This causes an unnecessarily high power consumption, which is avoided in embodiments according to the invention.

In the following, some key ideas of the present invention will be briefly summarized.

According to the invention, it has been found that in event generators usually the time instances when the events are about to occur are known well in advance, often at the beginning of a switching cycle (or counting cycle). According to an idea of the invention, it has been concluded that the counter does not need to run with the full accuracy, and so the full clock rate, all the time. Also, it has been found that, during a phase where one is sure (or, equivalently, for which it can be determined that) no event occurs (or will occur), the counter may be incremented or decremented by a larger value but with a lower clock frequency. Effectively, the change rate of the counter value (i.e., the change of the count value per time unit) may be unchanged. In other words, the change rate of the count value may be equal both in a phase where it is known that no event will occur and in a phase where it is expected that an event will occur. However, there are less clock events, less switching events in the counter itself, and less comparison tasks of the comparators (if the counter is incremented/decremented by a larger value but with a lower clock frequency). Thus, the power consumption is reduced by the factor by which the clock frequency is reduced and by which the increment/decrement value is increased. In the vicinity of an event (i.e., near to an occurrence of an event), the clock is switched back to the original rate (for example, to a full rate) and the increment/decrement value is also set to its original value (for example, to a small value, like, for example, to a value of 1). This means that the counter works fast but with a small, i.e., accurate, increment/decrement. In other words, the counter works with a low accuracy (for example, a low temporal accuracy) when it is guaranteed (or determined by an appropriate evaluation of a low-temporal-resolution count value) that no event occurs (at least within a predetermined period of time) and with a high accuracy when it is sure (or at least very likely) that an event happens soon (for example, within a predetermined time). By this approach, the digital circuitry has a comparatively high power consumption only in the vicinity of the occurrence of an event (i.e., near the occurrence of an event). The average power consumption is considerably reduced.

In an embodiment, the clock frequency is reduced not by clock dividers but by clock gating. This avoids additional synchronization and simplifies synthesis.

It should be noted that embodiments according to the invention will gain even more importance in the future when it is desired to move to higher switching frequencies. Nevertheless, already today a comparatively high power consumption in the digital control logic constitutes a problem, such that improvements can be achieved by using the event generation concept disclosed herein.

In the following, embodiments of a digital event generator according to the invention will be briefly described. A simple embodiment of a digital event generator comprises a counter which indicates a phase within a quasi periodic sequence. The occurrence of one or more events is described by digital values which are compared continuously (or quasi-continuously) to the counter. The counter runs with a low rate and coarse step size when no event is expected. Moreover, the counter runs with a high rate and fine step size when an event is about to occur.

This event generator may optionally be improved by using an event splitter which generates from each event a coarse event and a fine event. The coarse event (or coarse event time information) is used for comparison with the counter value during coarse operation of the counter. The fine event (or fine event time information) is used for comparison with the counter value during fine operation of the counter.

According to an optional improvement, a coarse comparator is enabled during coarse operation of the counter and disabled during fine operation of the counter.

According to another optional improvement, a fine comparator is enabled during the fine operation of the counter and disabled during the coarse operation of the counter.

According to another optional improvement, the fine comparator can resolve only relative events with respect to a coarse step of the counter.

According to another optional improvement, an internal interrupt may switch the counter to a certain operation mode.

According to another optional improvement, in a first step after the beginning of a new period, the counter is switched from its initial value to the next multiple of the coarse increment/decrement.

To conclude, aspects of the present disclosure allow to provide a high efficiency at low load currents in an energy converter. A power consumption of the digital event generator is comparatively small. Only in the vicinity of an event, a somewhat increased power consumption is required, such that good overall power efficiency can be achieved.

Aspects of the invention create a low power digital pulse width and event generator. Some The invention can be used in a power management unit.

The invention claimed is:

1. A digital event generator comprising:
   a counter configured to provide at least one count value based on a clock signal; and
   a comparator configured to evaluate a first portion of a first count value to detect a near occurrence of an event, in response to a detection of a near occurrence of an event, evaluate a second portion of a second count value, and to provide the event signal based on the evaluation and digital event time information,
   wherein the digital event generator is configured to reduce a counter step size in response to the detection of the near occurrence of the event, and to increase a counter clock rate in response to the detection of the near occurrence of the event.

2. The digital event generator according to claim 1, wherein the first portion and the second portion are the same portion.

3. The digital event generator according to claim 1, wherein the first count value and the second count value being the same count value.

4. The digital event generator according to claim 1, wherein the first portion or the second portion comprises a most-significant part of a number representation of the at least one count value, a least-significant part of the number representation of the at least one count value, or an intermediate part of the number representation of the at least one count value.

5. The digital event generator according to claim 1, wherein the comparator is configured to evaluate the first portion by performing a low-temporal-resolution comparison and to evaluate the second portion by performing a high-temporal-resolution comparison.

6. The digital event generator according to claim 5, wherein the digital event generator is configured to switch back to evaluate the first portion by performing a low-temporal-resolution count value comparison subsequent to a provision of an event signal based on the evaluation of the second portion by performing the high temporal resolution count value comparison.

7. The digital event generator according to claim 6, wherein the digital event generator is configured to operate in a second mode to evaluate the second portion by performing high-temporal-resolution count value comparison for at least a predetermined number of counter steps.

8. The digital event generator according to claim 5, wherein the digital event generator is configured to switch back to evaluate the first portion by performing a low-temporal-resolution count value comparison a predetermined number of counter steps after switching to a second mode to evaluate the second portion by performing the high-temporal-resolution count value comparison.

9. The digital event generator according to claim 1, wherein the comparator is configured to evaluate the first portion by performing a low-temporal-resolution comparison prior to the detection of the near occurrence of an event, and to evaluate the second portion by performing a high-temporal-resolution comparison in response to the detection of the near occurrence of an event.

10. The digital event generator according to claim 9, wherein the digital event generator is configured to detect the near occurrence of an event based on the low-temporal-resolution comparison.

11. The digital event generator according to claim 9, wherein the comparator is configured to evaluate a relative time, relative to a time determined by the low-temporal-resolution comparison, in the high-temporal-resolution comparison.

12. The digital event generator according to claim 1, wherein the first portion comprises a first set of bits and the second portion comprises a second set of bits,
   wherein the first set of bits describes a more-significant portion of the at least one count value than the second set of bits.

13. The digital event generator according to claim 1, wherein the digital event generator is configured to provide event signals for a plurality of events in response to a single switching to a second mode to evaluate the second portion by performing high-temporal-resolution count value comparison.

14. The digital event generator according to claim 1, wherein the comparator is configured to provide a plurality of event signals by comparing a high-temporal-resolution count value with a plurality of digital event time information associated with a plurality of events.

15. The digital event generator according to claim 1, wherein the counter is a synchronous counter, wherein a plurality of counter stages are clocked with a common clock signal, and
    wherein the digital event generator comprises a clock divider or a clock gate to derive the common clock signal for the counter from an input clock signal.

16. The digital event generator according to claim 15, wherein the digital event generator is configured to control the clock divider or clock gate, to provide a clock signal of a first, low clock rate as the common clock signal for the counter prior to the detection of the near occurrence of an event, and to provide a clock signal of a second, higher clock rate as the common clock signal for the counter in response to the detection of the near occurrence of an event.

17. The digital event generator according to claim 1, wherein the digital event generator is configured to perform a smaller number of comparisons per time unit prior to the detection of the near occurrence of an event than in response to the detection of the near occurrence of an event.

18. The digital event generator according to claim 1, wherein the digital event generator further comprises a digital-to-time converter configured to receive, as an input signal, the event signal provided by the comparator, and to provide, as an output signal, a fine-adjusted event signal,
    wherein the comparator is configured to detect a near occurrence of an event based on a low-temporal-resolution portion of the digital event time information and to provide the event signal based on a medium-temporal-resolution portion of the digital event time information, and
    wherein the digital-to-time converter is configured to provide the time-adjusted event signal based on a high-temporal-resolution portion of the digital event time information.

19. The digital event generator according to claim 18, wherein the digital-to-time converter comprises a tapped delay line,
    wherein the tapped delay line is configured to receive the event signal provided by the comparator, and
    wherein the digital-to-time converter is configured to select a tap of the tapped delay line to provide the fine-adjusted event signal based on the high-temporal-resolution portion of the digital event time information.

20. The digital event generator according to claim 1, wherein the counter is configured to cyclically restart from a start value.

21. A switched-mode energy converter comprising:
    a power stage comprising one or more switches;
    a digital control circuit configured to provide a digital event time information, to control or regulate an electrical output quantity; and
    a digital event generator for generating an event signal based on the digital event time information, the digital event generator comprising:
        a counter configured to provide at least one count value based on a clock signal; and
        a comparator configured to evaluate a first portion of a first count value to detect a near occurrence of an event, in response to a detection of a near occurrence of an event, evaluate a second portion of a second count value, and to provide the event signal based on the evaluation and digital event time information,
    wherein the digital event generator further comprises a digital-to-time converter configured to receive, as an input signal, the event signal provided by the comparator, and to provide, as an output signal, a fine-adjusted event signal,
    wherein the comparator is configured to detect a near occurrence of an event based on a low-temporal-resolution portion of the digital event time information and to provide the event signal based on a medium-temporal-resolution portion of the digital event time information, and
    wherein the digital-to-time converter is configured to provide the time-adjusted event signal based on a high-temporal-resolution portion of the digital event time information.

22. The energy converter according to claim 21, wherein the digital event time information describes a switch-on time of a switch of the power stage, a switch-off time of a switch of the power stage, a sample time of an analog-digital converter or a control time.

23. A comparator for providing an event signal, wherein the comparator is configured to evaluate a low-temporal-resolution portion of a first count value to detect a near occurrence of an event, and
    to evaluate a high-temporal-resolution portion of a second count value in response to a detection of a near occurrence of an event, and to generate the event signal based on the evaluation of the high-temporal-resolution portion of the count value and digital event time information, wherein the second count value has a reduced counter step size when compared to the first count value,
    wherein the reduced counter step size of the second count value is evaluated in response to the detection of the near occurrence of the event, and a counter clock rate associated with the comparator is increased in response to the detection of the near occurrence of the event.

24. The comparator according to claim 23, wherein the comparator is configured to detect the near occurrence of an event based on a comparison between the low-temporal-resolution portion of the first count value and a low-temporal-resolution portion of the digital event time information.

25. The comparator according to claim 23, wherein the comparator is configured to evaluate a first subset of bits of at least the first count value prior to a detection of a near occurrence of an event, and to evaluate a second subset of bits of the second count value in response to the detection of the near occurrence of an event, wherein the first subset of bits describes a more-significant portion of the count values than the second subset of bits.

26. The comparator according to claim 23, wherein the comparator is configured to evaluate a relative time, which is relative to a time-determined by a low-temporal-resolution comparison, in a high-temporal-resolution comparison.

27. A method for providing an event signal, the method comprising:
    providing a plurality of count values based on a clock signal;
    evaluating a first portion of a first count value, to detect a near occurrence of an event;
    evaluating a second portion of a second count value in response to a detection of a near occurrence of an event; and
    generating the event signal from the evaluation of the second portion of the second count value and a digital event time information,
    reducing a counter step size in response to the detection of the near occurrence of the event; and increasing a counter clock rate in response to the detection of the near occurrence of the event.

28. The method according to claim 27, wherein a clock rate according to which the count values are provided is switched from a first clock value to a second value, which is smaller than the first value, in response to the detection of the near occurrence of an event.

29. A digital event generator comprising:
a counter configured to provide a plurality of count values based on a clock signal; and
a comparator configured to evaluate a first portion of a first count value to detect a near occurrence of an event,
  in response to a detection of a near occurrence of an event, evaluate a second portion of a second count value, and
  to provide the event signal based on the evaluation and digital event time information;
wherein the digital event generator is configured to reduce a counter step size in response to the detection of the near occurrence of an event, and to increase a counter clock rate in response to the detection of the near occurrence of an event;
wherein the comparator is configured to perform a low-temporal-resolution comparison prior to the detection of the near occurrence of an event, and to perform a high-temporal-resolution comparison in response to the detection of the near occurrence of an event;
wherein the digital event generator is configured to detect the near occurrence of an event based on the low-temporal-resolution comparison;
wherein the comparator is configured to evaluate a first subset of bits of the first count value prior to the detection of the near occurrence of an event, and to evaluate a second subset of bits of the second count value in response to the detection of the near occurrence of an event,
wherein the first subset of bits describes a more-significant portion of the count values than the second subset of bits; and
wherein the comparator is configured to evaluate a relative time, which is relative to a time determined by the low-temporal-resolution comparison, in the high-temporal-resolution comparison.

30. A digital event generator for providing an event signal on the basis of a digital event time information, the digital event generator comprising:
a counter configured to provide count values in dependence on a clock signal; and
a comparator configured to evaluate a low-temporal-resolution count value provided by the counter, to detect a near occurrence of an event, and to evaluate a high-temporal-resolution count value provided by the counter in response to a detection of a near occurrence of an event, and to provide the event signal on the basis of the evaluation of the high-temporal-resolution count value and in dependence on the digital event time information,
wherein the digital event generator is configured to reduce a counter step size in response to the detection of the near occurrence of the event, and to increase a counter clock rate in response to the detection of the near occurrence of the event.

* * * * *